United States Patent
Grobis et al.

(10) Patent No.: US 12,093,812 B2
(45) Date of Patent: Sep. 17, 2024

(54) ULTRALOW POWER INFERENCE ENGINE WITH EXTERNAL MAGNETIC FIELD PROGRAMMING ASSISTANCE

(71) Applicant: SanDisk Technologies LLC, Addison, TX (US)

(72) Inventors: Michael Grobis, Campbell, CA (US); Michael Nicolas Albert Tran, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 1018 days.

(21) Appl. No.: 17/061,798

(22) Filed: Oct. 2, 2020

(65) Prior Publication Data
US 2022/0108158 A1   Apr. 7, 2022

(51) Int. Cl.
| | | |
|---|---|---|
| *G11C 11/15* | (2006.01) | |
| *G06F 17/16* | (2006.01) | |
| *G06N 3/065* | (2023.01) | |
| *G06N 3/08* | (2023.01) | |
| *H03M 1/12* | (2006.01) | |
| *H03M 1/66* | (2006.01) | |

(52) U.S. Cl.
CPC ............. *G06N 3/065* (2023.01); *G06F 17/16* (2013.01); *G06N 3/08* (2013.01); *G11C 11/15* (2013.01);
(Continued)

(58) Field of Classification Search
CPC .......... G06N 3/065; G06N 3/08; G06N 3/045; G06N 3/063; G06F 17/16; G11C 11/15;
(Continued)

(56) References Cited

U.S. PATENT DOCUMENTS

| | | | |
|---|---|---|---|
| 2003/0223283 A1* | 12/2003 | Kunikiyo | G11C 11/16 365/200 |
| 2012/0127785 A1 | 5/2012 | Roelofs et al. | |
| 2020/0006624 A1 | 1/2020 | Wang et al. | |

FOREIGN PATENT DOCUMENTS

| | | | | |
|---|---|---|---|---|
| CN | 106463169 B | * | 5/2019 | ........... G11C 11/161 |
| CN | 111029303 | * | 4/2020 | |

(Continued)

OTHER PUBLICATIONS

Dally, William J., et al., "Hardware-Enabled Artificial Intelligence," Syposium on VLSI Circuits Digest of Technical Papers, Jun. 2018, 4 pages.
(Continued)

*Primary Examiner* — Hoai V Ho
(74) *Attorney, Agent, or Firm* — Vierra Magen Marcus LLP

(57) ABSTRACT

An MRAM-based vector multiplication device, such as can be used for inferencing in a neural network, is presented that is ultralow power, low cost, and does not require special on-chip programming. A crosspoint array has an MRAM cell at each crosspoint junction and periphery array circuitry capable of supplying independent input voltages to each word line and reading current on each bit line. Vector multiplication is performed as an in-array multiplication of a vector of input voltages with matrix weight values encoded by the MRAM cell states. The MRAM cells can be individually programmed using a combination of input voltages and an external magnetic field. The external magnetic field is chosen so that a write voltage of one polarity reduces the anisotropy sufficiently to align the cell state with the external field, but is insufficient to align the cell if only half of the write voltage is applied.

19 Claims, 23 Drawing Sheets

(52) U.S. Cl.
CPC ......... *H03M 1/1205* (2013.01); *H03M 1/662* (2013.01)

(58) Field of Classification Search
CPC . G11C 11/54; G11C 11/1675; G11C 11/1655; G11C 11/1657; G11C 5/04; G11C 11/161; G11C 11/1659; H03M 1/1205; H03M 1/662
USPC ........................................................ 365/148
See application file for complete search history.

(56) References Cited

FOREIGN PATENT DOCUMENTS

| | | | |
|---|---|---|---|
| DE | 102019134288 A1 * | 8/2020 | ........... G11C 11/161 |
| JP | 2010278713 A | 12/2010 | |
| JP | 2013070275 A | 4/2013 | |
| KR | 20200005657 A | 1/2020 | |
| TW | I592928 B | 7/2017 | |
| TW | I602331 B | 10/2017 | |
| TW | 202034458 A | 9/2020 | |
| WO | 2019108334 A1 | 6/2019 | |
| WO | 2020129204 A1 | 6/2020 | |
| WO | 2020178903 A1 | 9/2020 | |

OTHER PUBLICATIONS

Cosemans, S., et al., "Towards 10000TOPS/W DNN Inference with Analog in-Memory Computing—A Circuit Blueprint, Device Options and Requirements," IEEE International Electron Devices Meeting (IEDM), Dec. 2019, 4 pages.

* cited by examiner

ULTRALOW POWER INFERENCE ENGINE WITH EXTERNAL MAGNETIC FIELD PROGRAMMING ASSISTANCE

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWING

Like-numbered elements refer to common components in the different figures.

DETAILED DESCRIPTION

When a neural network performs an inference or training operation, large numbers of computations each involving large amounts of data are performed, particularly in the case of Deep Neural Networks, or DNNs, whose structures involve large numbers of network layers, such as fully connected and convolutional layers, through which the inputs are propagated. To avoid the movement of large amounts of data in and out of the memory device, the weights of the layers for a neural network are stored in the non-volatile memory arrays of the memory device and the computations for each of the layers are performed on the device. To perform the in-array multiplication of inputs and weights for layers of a neural network, the weight values are stored in an array of magnetoresistive random access memory (MRAM) cells having a crosspoint structure in which an MRAM cell is located at each crosspoint junction between word lines and bit lines. The MRAM memory cells can be formed to have high resistance values for both a low resistance state and a high resistance state, while still maintaining a large relative difference between the states. Vector multiplication is performed as an in-array multiplication between a vector of input voltages, corresponding to the input vector for a layer of a neural network, and a matrix of weight values encoded by the MRAM cell states. As the memory cells will draw little current even when in a low resistance state, multiple word lines and multiple bit lines can be sensed concurrently in a low power, in-array multiplication operation. The MRAM cells can be individually programmed using a combination of input voltages and an external magnetic field. The external magnetic field is chosen so that a set of programming voltages reduces the anisotropy sufficiently to align a selected memory cell's state with the external field, but is insufficient to align the memory cell if only half of the write voltage is applied.

Figure 1:
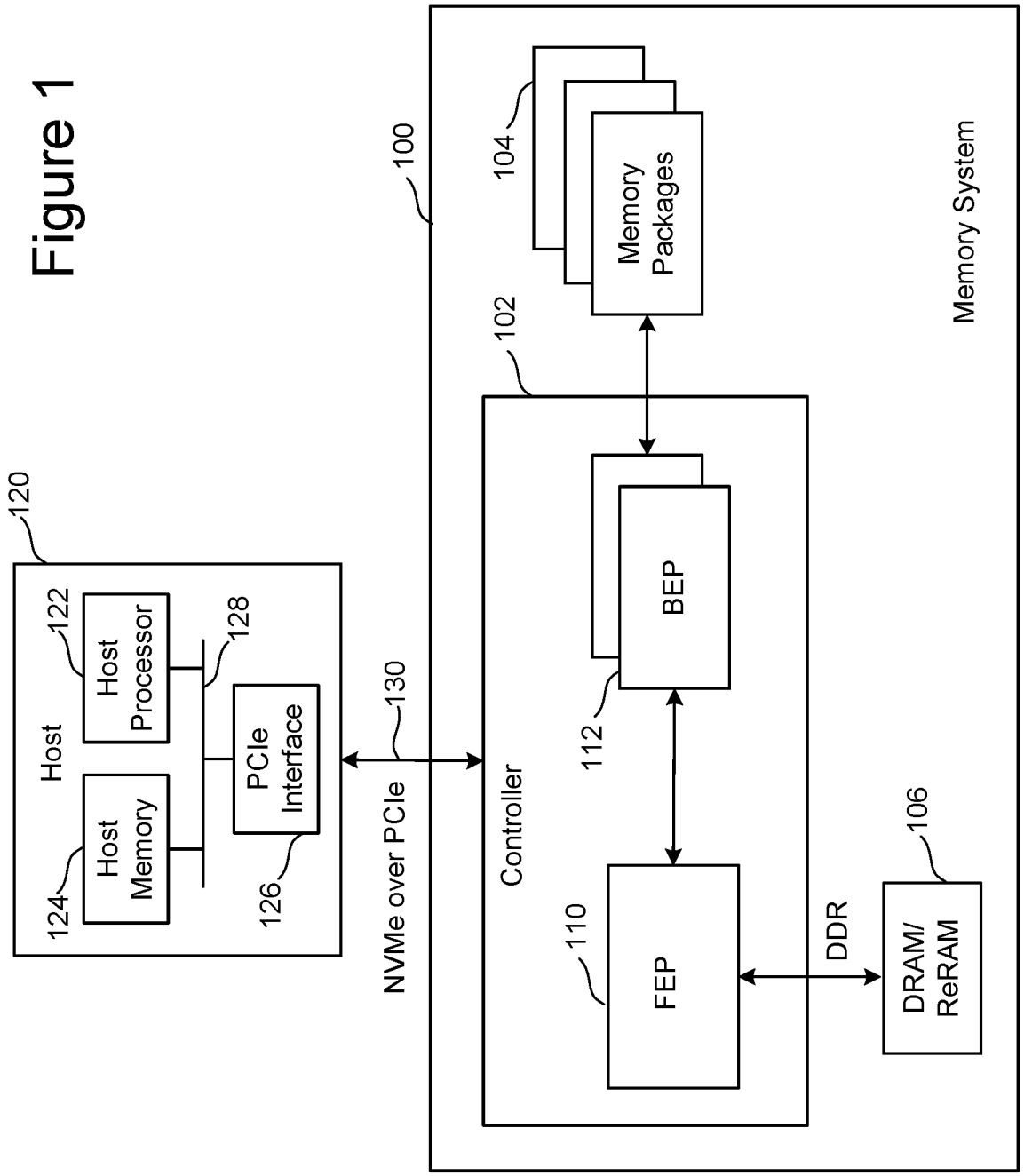
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g., DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM).

Controller 102 communicates with host 120 via an interface 130 that implements a protocol like, for example, NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory, or another type of storage. Host 120 is external to and separate from memory system 100. In one embodiment, memory system 100 is embedded in host 120.

Figure 2:
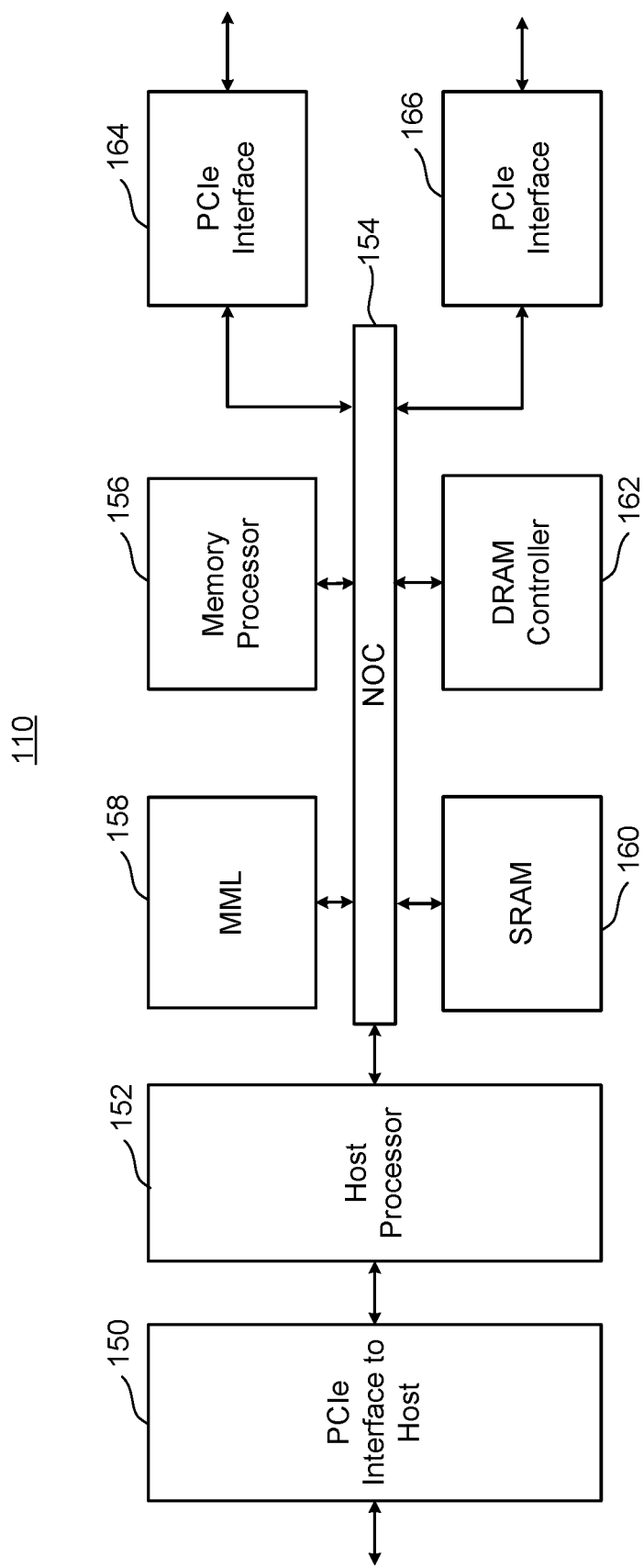
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
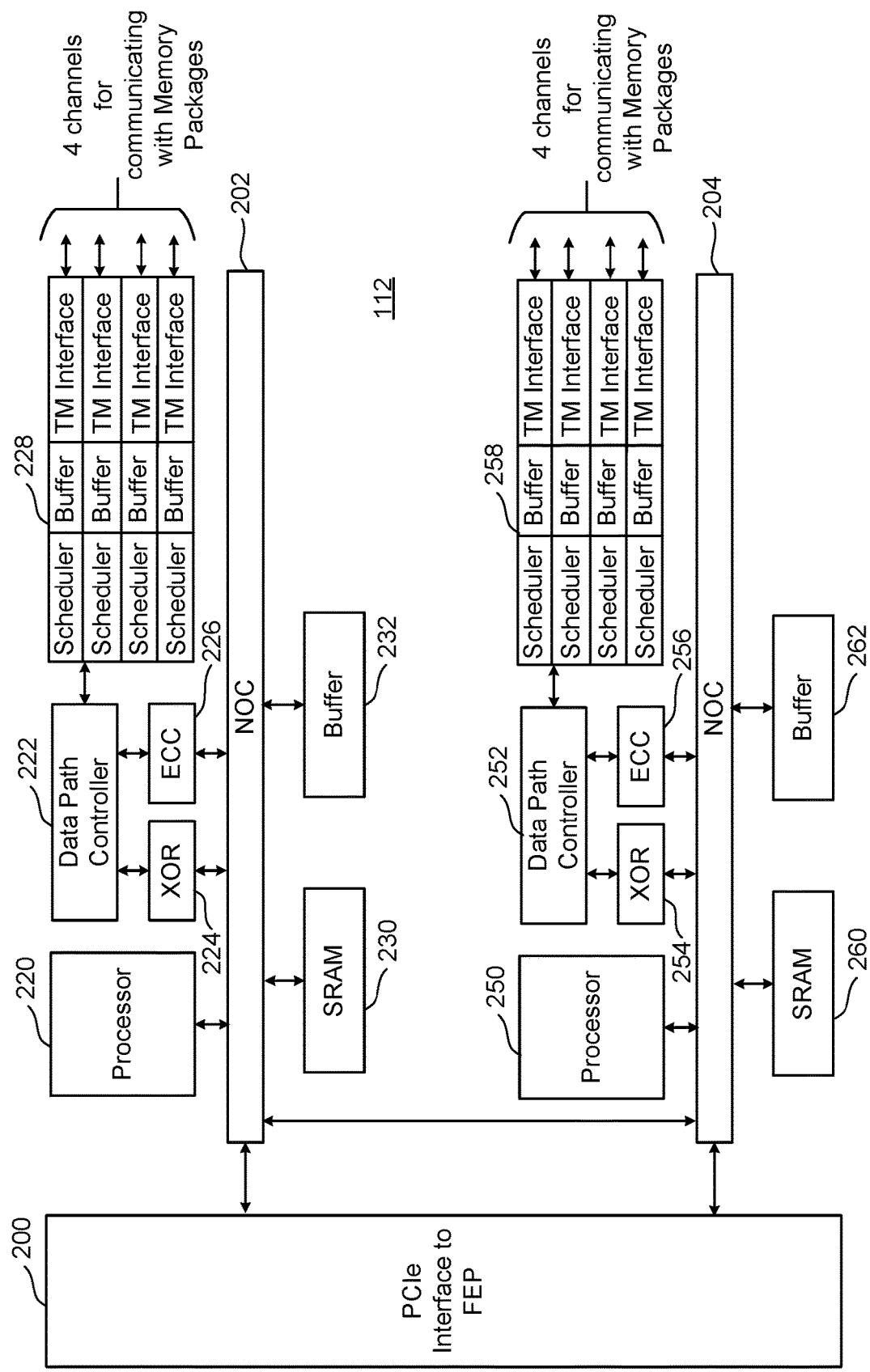
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
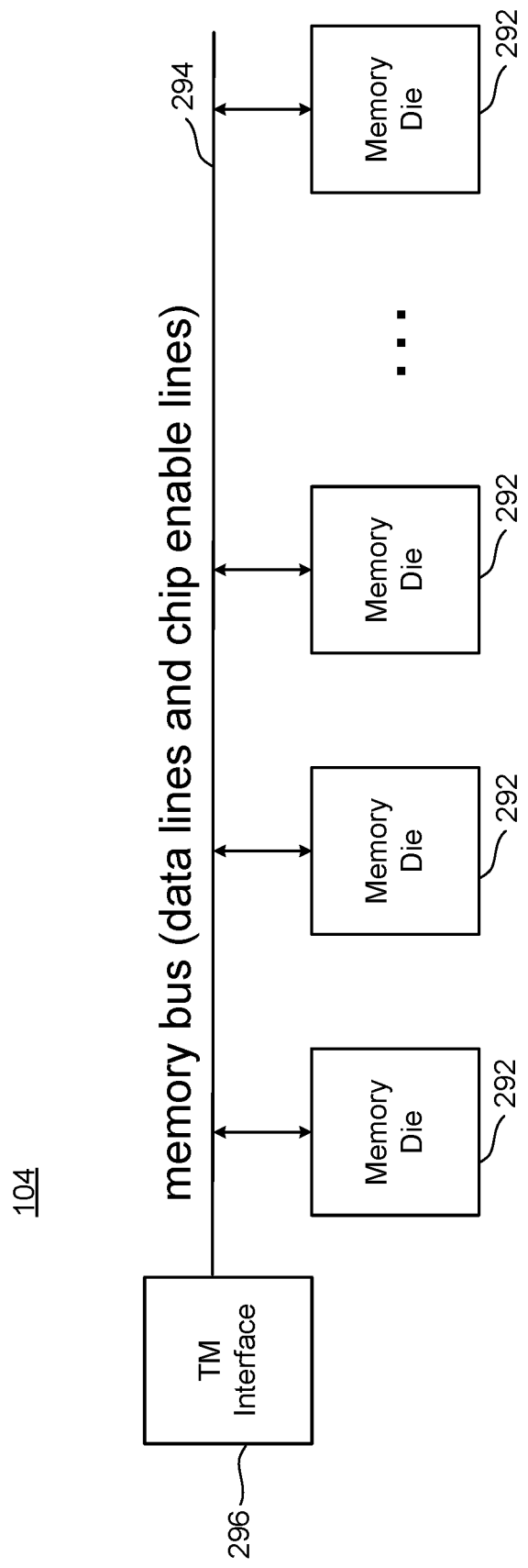
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
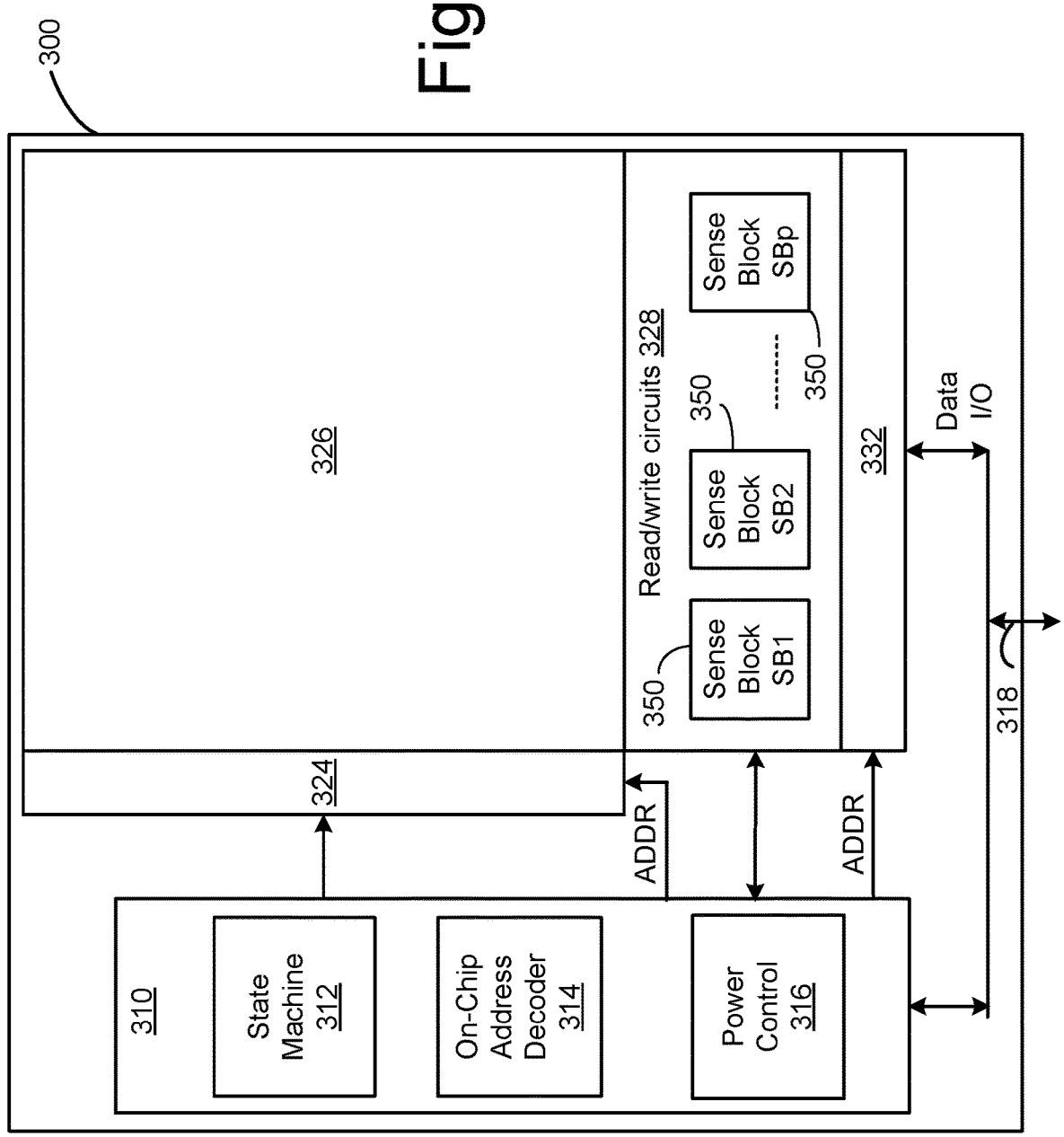
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" can include a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM crosspoint memory includes reversible resistance-switching elements arranged in crosspoint arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data by magnetic storage elements. The elements are formed from two ferromagnetic thin films, also known as layers, each of which are ferromagnetic, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the memory structure 326 of the memory cells and the peripheral circuitry, including all of the other elements. An important characteristic of a memory circuit is its capacity, which can be increased by increasing the area of the memory die 300 that is given over to the memory structure 326; however, this reduces the area of the memory die 300 available for the peripheral circuitry. This can place quite severe restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is the amount of area to devote to the memory structure 326 and the amount of area to devote to the peripheral circuitry.

Another area in which the memory structure 326 and the peripheral circuitry are often at odds is in the processing involved in forming these regions, since these regions often involve differing processing technologies and the trade-off in having differing technologies on a single die. For example, when the memory structure 326 is NAND flash, this is an NMOS structure, while the peripheral circuitry is often CMOS based. For example, sense amplifier circuits in the sense blocks 350, charge pumps in the power control block 316, logic elements in the state machine 312, and other peripheral circuitry often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
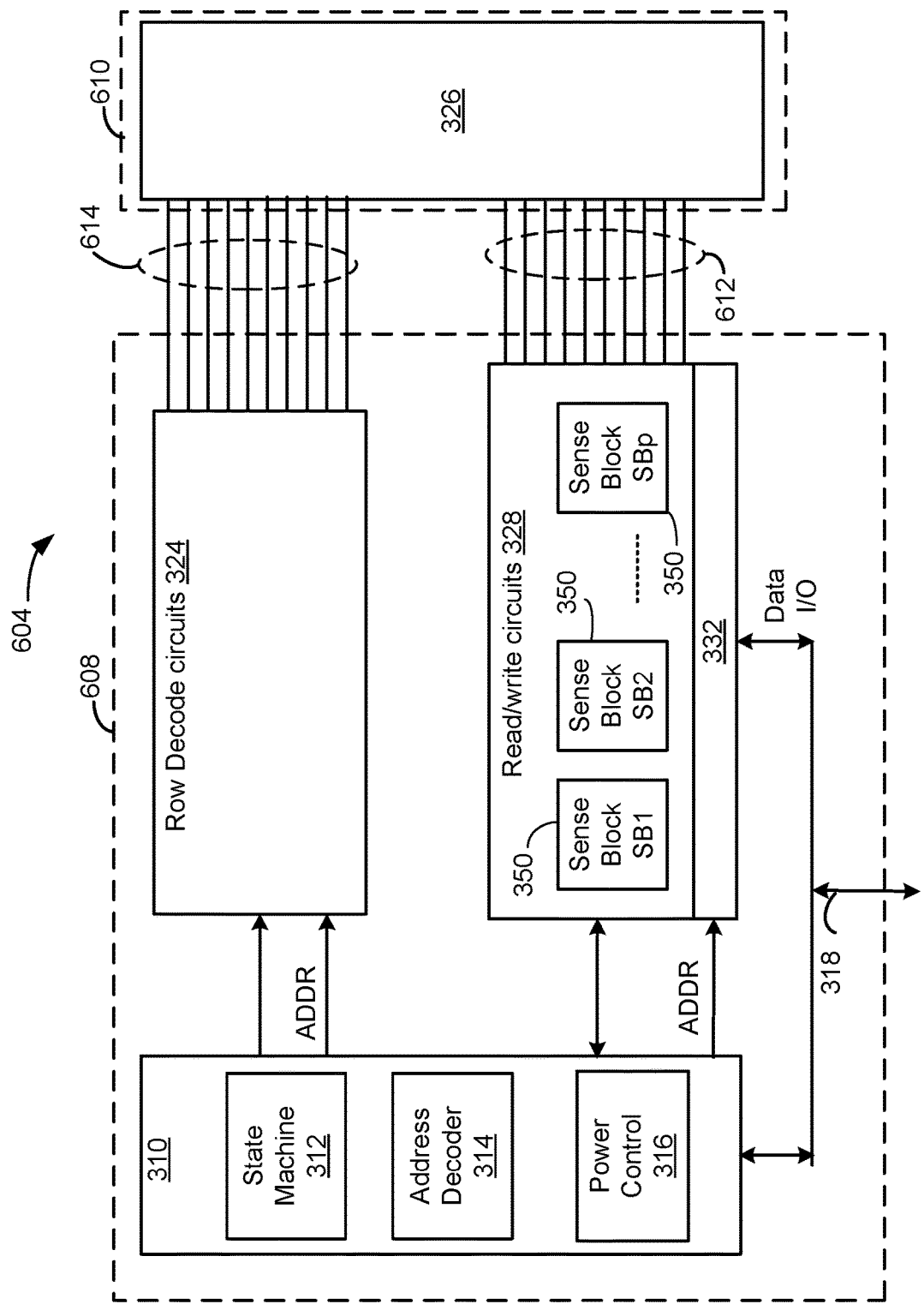
FIGS. 6A and 6B illustrate an example of control circuits coupled to a memory structure through wafer-to-wafer bonding.
Figure 6B:
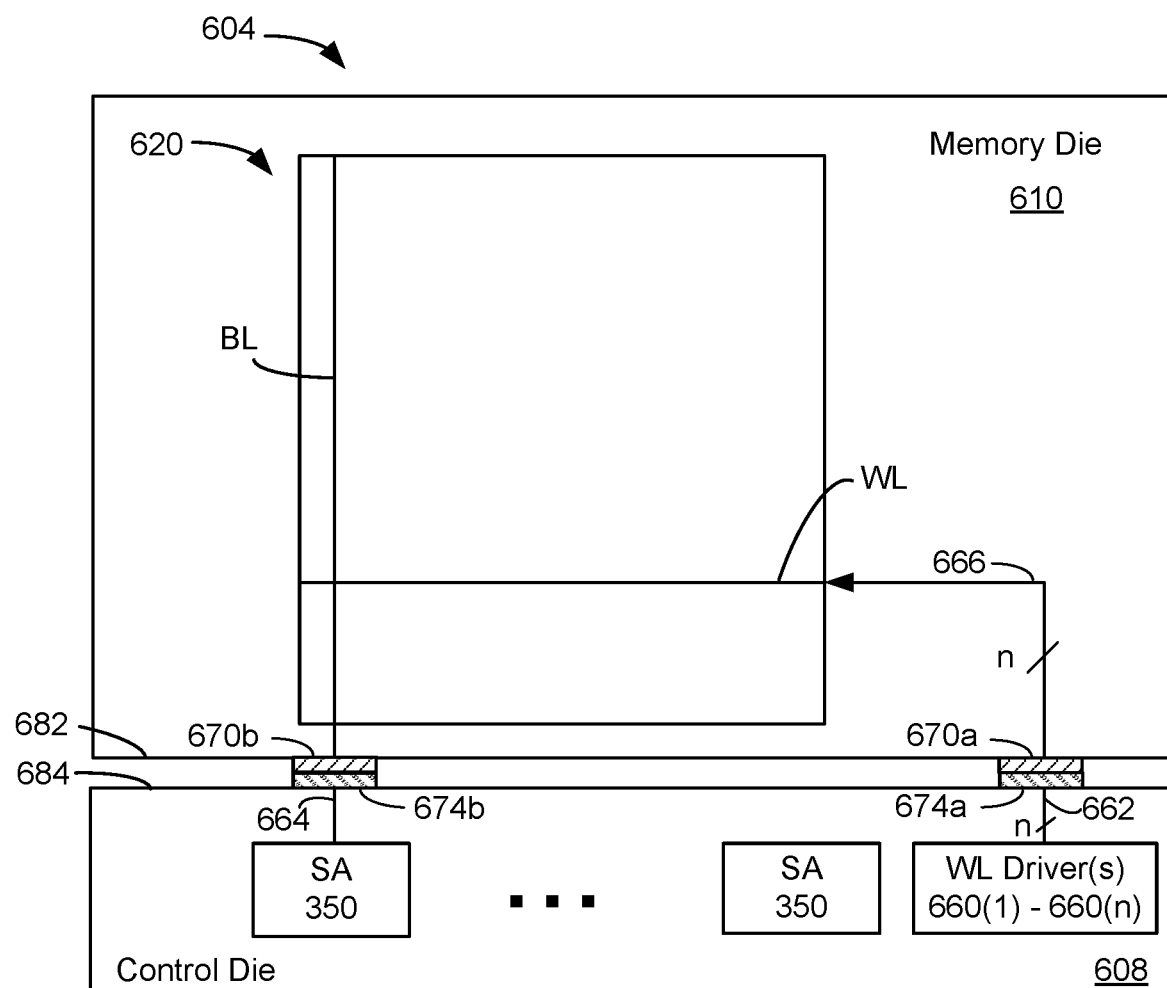

FIGS. 6A and 6B shows an alternative arrangement to that of FIG. 5, which may be implemented using wafer-to-wafer bonding to provide a bonded die pair 604. FIG. 6A shows an example of the peripheral circuitry, including control circuits, formed in a peripheral circuit or control die 608 coupled to memory structure 326 formed in memory die 610. Common components are numbered as in FIG. 5. It can be seen that control circuitry 310, read/write circuits 328, and row decoder 324 (which may be formed by a CMOS process) are located in control die 608. Additional elements, such as functionalities from controller 102 can also be moved into the control die 608. Control circuitry 310, read/write circuits 328, row decoder 324, and column decoder 332 may be formed by a common process (e.g., CMOS process), so that adding elements and functionalities more typically found on a memory controller 102 may require few or no additional process steps (i.e., the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control die 608 may not require any additional process steps.

FIG. 6A shows read/write circuits 328 on the control die 608 coupled to memory structure 326 on the memory die 610 through electrical paths 612. For example, electrical paths 612 may provide electrical connection between read/write circuits 328 and bit lines of memory structure 326. Electrical paths may extend from read/write circuits 328 in control die 608 through pads on control die 608 that are bonded to corresponding pads of the memory die 610, which are connected to bit lines of memory structure 326. Each bit line of memory structure 326 may have a corresponding electrical path in electrical paths 612, including a pair of bonded pads, that connects to read/write circuits 328. Similarly, row decoder circuits 324 are coupled to memory structure 326 through electrical paths 614. Each of electrical path 614 may correspond to a word line, dummy word line, or select gate line. Additional electrical paths may also be provided between control die 608 and memory die 610.

FIG. 6B is a block diagram showing more detail on the arrangement of one embodiment of the integrated memory assembly of bonded die pair 604. Memory die 610 contains a plane 620 or array of memory cells. The memory die 610 may have additional planes or arrays. One representative bit line (BL) and representative word line (WL) is depicted for each plane or array 620. There may be thousands or tens of thousands of such bit lines per each plane or array 620. In one embodiment, an array or plane represents a groups of connected memory cells that share a common set of unbroken word lines and unbroken bit lines.

Control die 608 includes a number of sense amplifiers (SA) 350. Each sense amplifier 350 is connected to one bit line or may be connected to multiple bit lines in some embodiments. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 608 includes a number of word line drivers 660(1)-660(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 (e.g., part of Power Control 316) provide voltages to the word lines in memory die 610. As discussed above with respect to FIG. 6A, the control die 608 may also include charge pumps, voltage generators, and the like that are not represented in FIG. 6B, which may be used to provide voltages for the word line drivers 660 and/or the bit line drivers.

The memory die 610 has a number of bond pads 670a, 670b on a first major surface 682 of memory die 610. There may be "n" bond pads 670a, to receive voltages from a corresponding "n" word line drivers 660(1)-660(n). There may be one bond pad 670b for each bit line associated with plane 620. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 604. For example, the data bus between the memory controller 102 and the integrated memory assembly 604 may, for example, provide for eight, sixteen, or perhaps 32 bits to be transferred in parallel. However, the data bus between the memory controller 102 and the integrated memory assembly 604 is not limited to these examples.

The control die 608 has a number of bond pads 674a, 674b on a first major surface 684 of control die 608. There may be "n" bond pads 674a, to deliver voltages from a corresponding "n" word line drivers 660(1)-660(n) to memory die 610. There may be one bond pad 674b for each bit line associated with plane 620. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 610 to the control die 608.

Also, the bond pads 670, 674 permit internal signal transfer between the memory die 610 and the control die 608. Thus, the memory die 610 and the control die 608 are bonded together with bond pads. Although FIG. 6A depicts one control die 608 bonded to one memory die 610, in another embodiment one control die 608 is bonded to multiple memory dies 610.

Herein, "internal signal transfer" means signal transfer between the control die 608 and the memory die 610. The internal signal transfer permits the circuitry on the control die 608 to control memory operations in the memory die 610. Therefore, the bond pads 670, 674 may be used for memory operation signal transfer. Herein, "memory operation signal transfer" refers to any signals that pertain to a memory operation in a memory die 610. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier 350 may be electrically connected to bond pad 674b by pathway 664. Relative to FIG. 6A, the electrical paths 612 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 614 can correspond to the pathway 662, the bond pads 674a, and bond pads 670a. Note that pathways 662 may comprise a separate conductive pathway for each word line driver 660(1)-660(n). Likewise, a there may be a separate bond pad 674a for each word line driver 660(1)-660(n). The word lines in block 2 of the memory die 610 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features. For example, these activation functions can include addition and threshold determination operations used in the accumulation portion of Multiple and ACcumulation (MAC) operations, but more advanced operations such as sigmoid or tanh functions.

In the following, state machine 312 and/or controller 102 (or equivalently functioned circuits), in combination with all or a subset of the other circuits depicted on the control die 608 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Turning now to types of data that can be stored in non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 7:
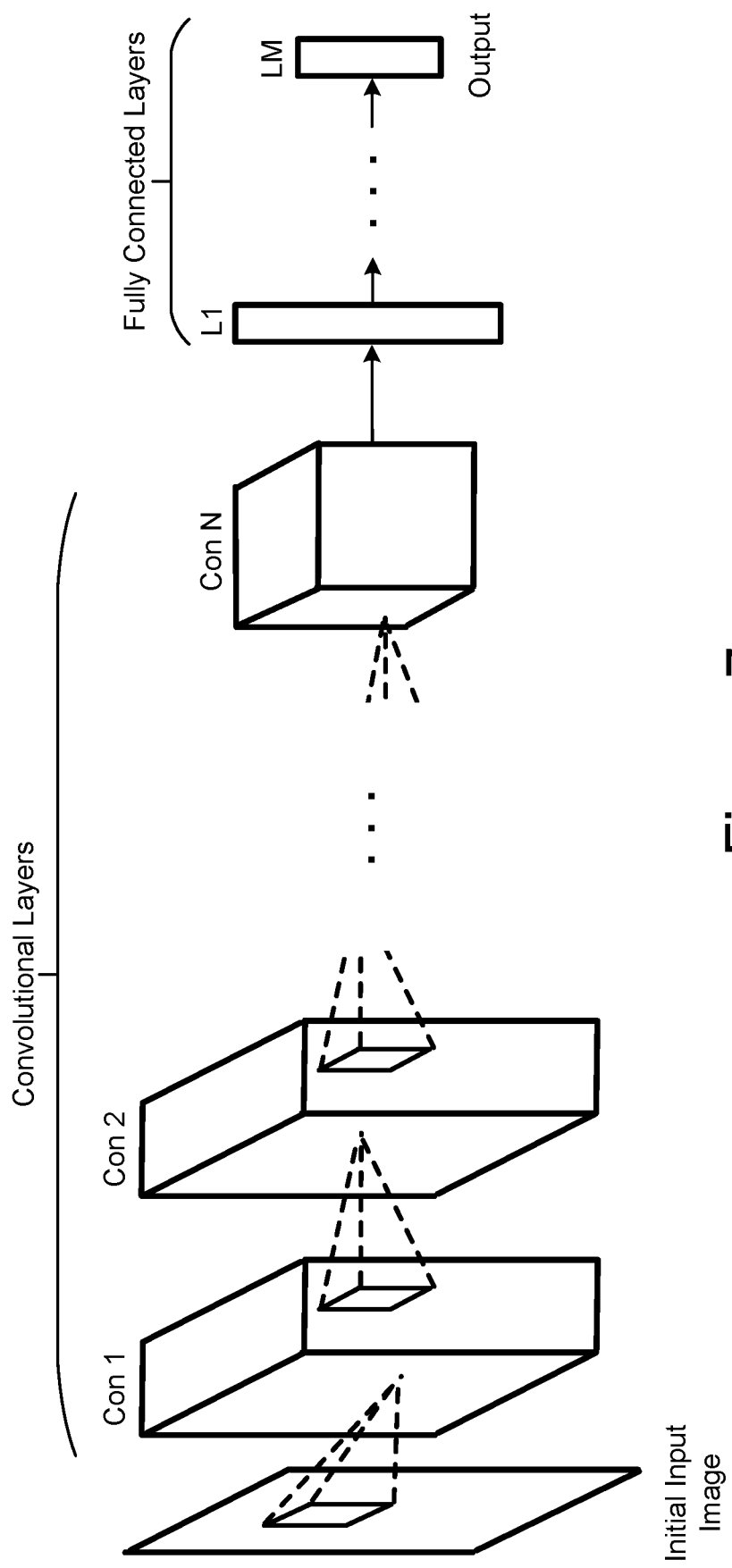
FIG. 7 illustrates a simple example of a convolutional neural network (CNN).

FIG. 7 is a schematic representation of an example of a CNN. FIG. 7 illustrates an initial input image of an array of pixel values, followed by a number of convolutional layers that are in turn followed by a number of fully connected layers, the last of which provides the output. Each neuron in the first convolutional layer (Con 1) takes as input data from an n×n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con1 to Con N) using each layer's learned weights, after which it is propagated through the fully connected layers (L1 to LM) using their learned weights.

Figure 8:
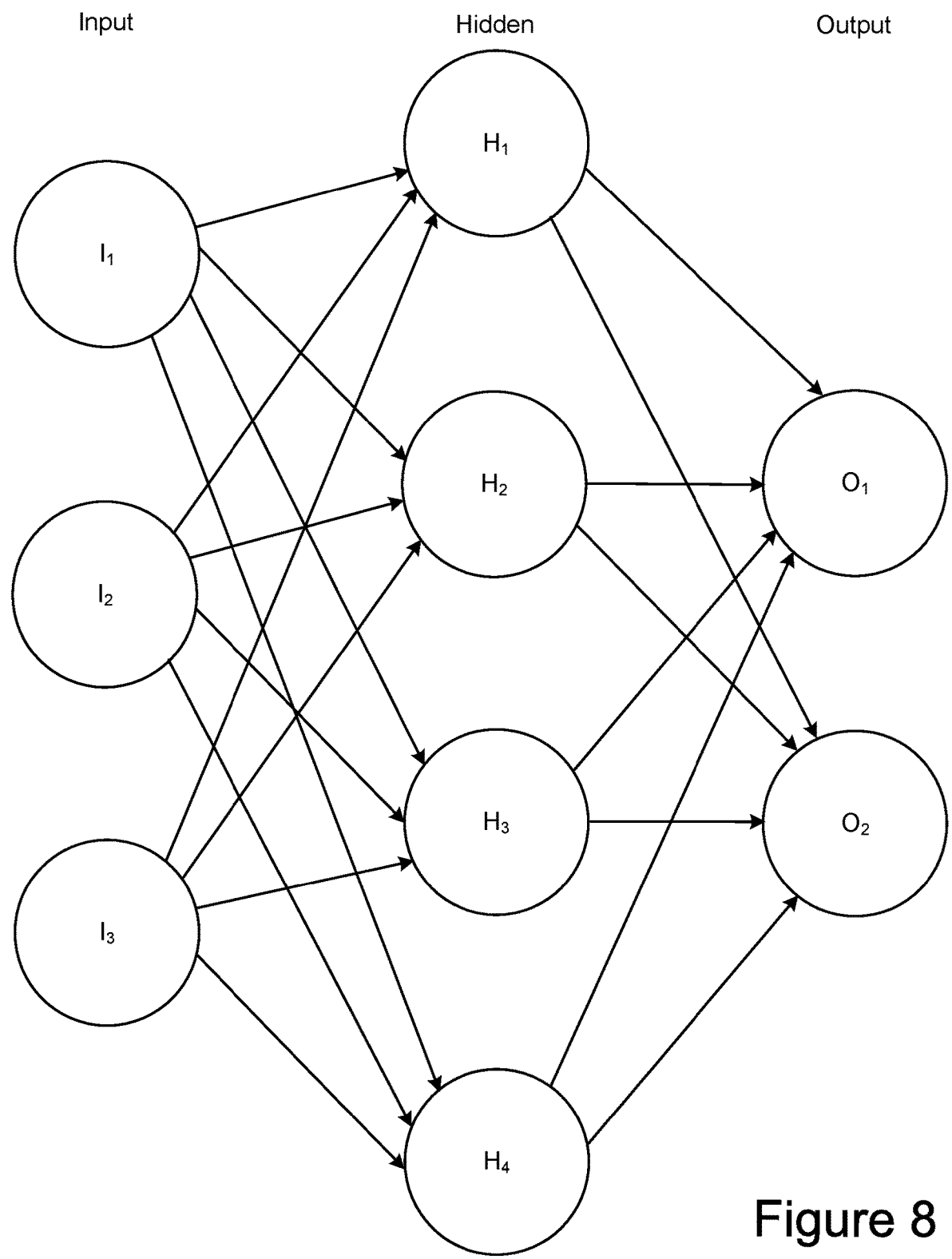
FIG. 8 illustrates a simple example of fully connected layers in an artificial neural network.

FIG. 8 represents several fully connected layers of a neural network in more detail. In FIG. 8 the shown three layers of the artificial neural network are represented as an interconnected group of nodes or artificial neurons, represented by the circles, and a set of connections from the output of one artificial neuron to the input of another. The example shows three input nodes ($I_1, I_2, I_3$) and two output nodes ($O_1, O_2$), with an intermediate layer of four hidden or intermediate nodes ($H_1, H_2, H_3, H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 7 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 9B:
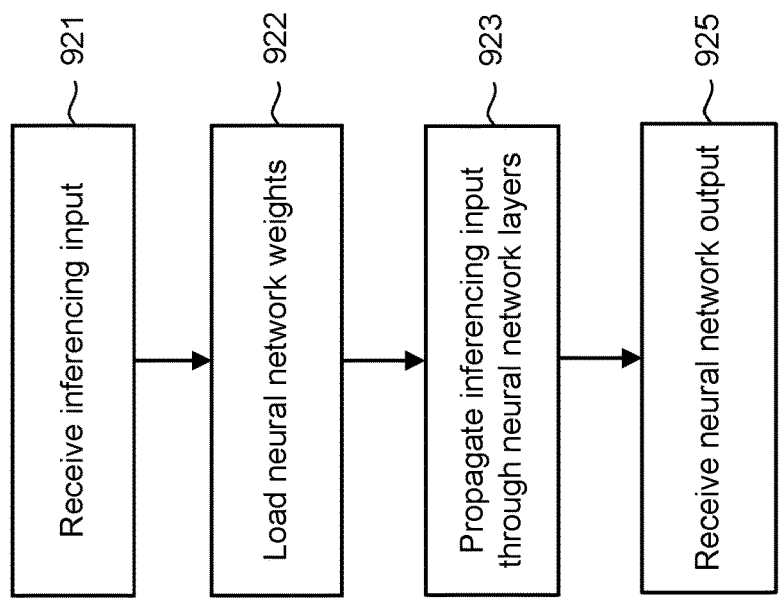
FIG. 9B is a flowchart describing one embodiment of a process for inference using a neural network.
Figure 9A:
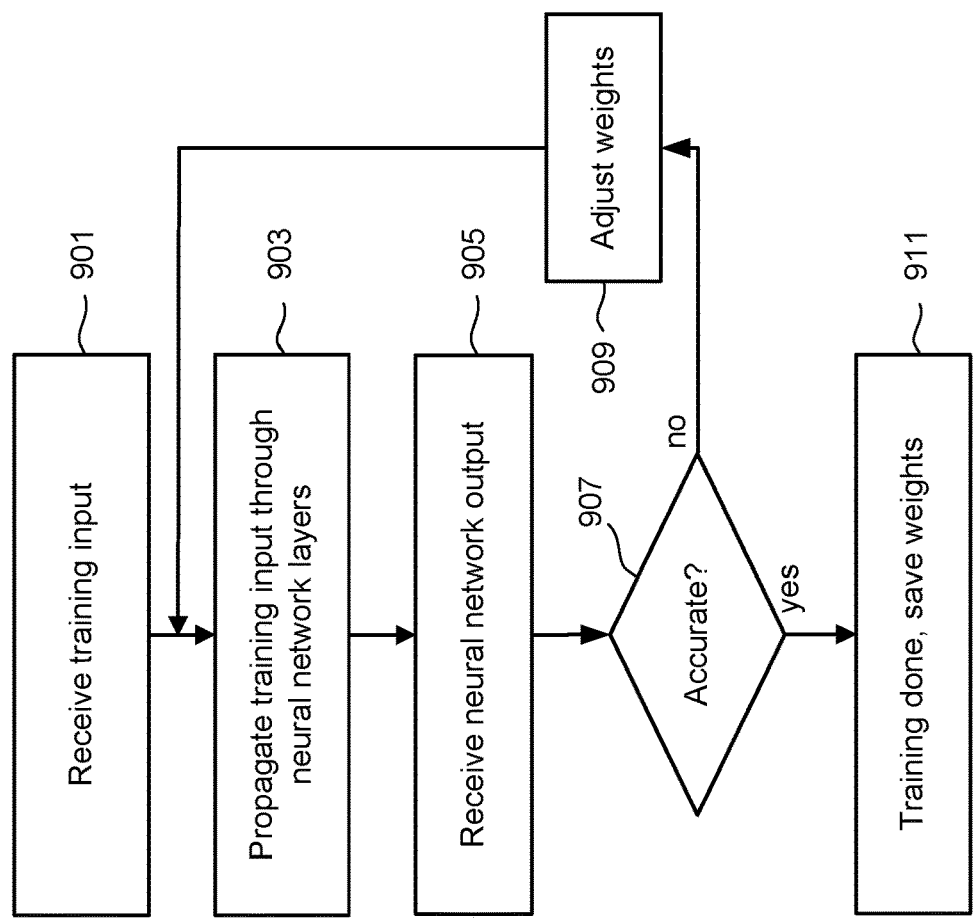
FIG. 9A is a flowchart describing one embodiment of a process for training a neural network to generate a set of weights.

FIG. 9A is a flowchart describing one embodiment of a process for training a neural network to generate a set of weights. The training process is often performed in the cloud, allowing additional or more powerful processing to be accessed. At step 901, the input, such as a set of images, is received (e.g., the image input in FIG. 7). At step 903 the input is propagated through the layers connecting the input to the next layer (e.g., CON1 in FIG. 7) using the current filter, or set of weights. The neural network's output is then received at the next layer (e.g., CON2 in FIG. 7) in step 905, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 905. A user can then review the results at step 907 to select which probabilities the neural network should return and decide whether the current set of weights supply a sufficiently accurate labelling and, if so, the training is complete (step 911). If the result is not sufficiently accurate, the neural network adjusts the weights at step 909 based on the probabilities the user selected, followed by looping back to step 903 to run the input data again with the adjusted weights. Once the neural network's set of weights have been determined, they can be used to "inference," which is the process of using the determined weights to generate an output result from data input into the neural network. Once the weights are determined at step 911, they can then be stored in non-volatile memory for later use, where the storage of these weights in non-volatile memory is discussed in further detail below.

FIG. 9B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 921, the input is received, such as the image of a dog in the example used above. If the previously determined weights are not present in the device running the neural network application, they are loaded at step 922. For example, on a host processor executing the neural network, the weights could be read out of an SSD in which they are stored and loaded into RAM on the host device. At step 923, the input data is then propagated through the neural network's layers. Step 923 will be similar to step 903 of FIG. 9B, but now using the weights established at the end of the training process at step 911. After propagating the input through the intermediate layers, the output is then provided at step 925.

Figure 10:
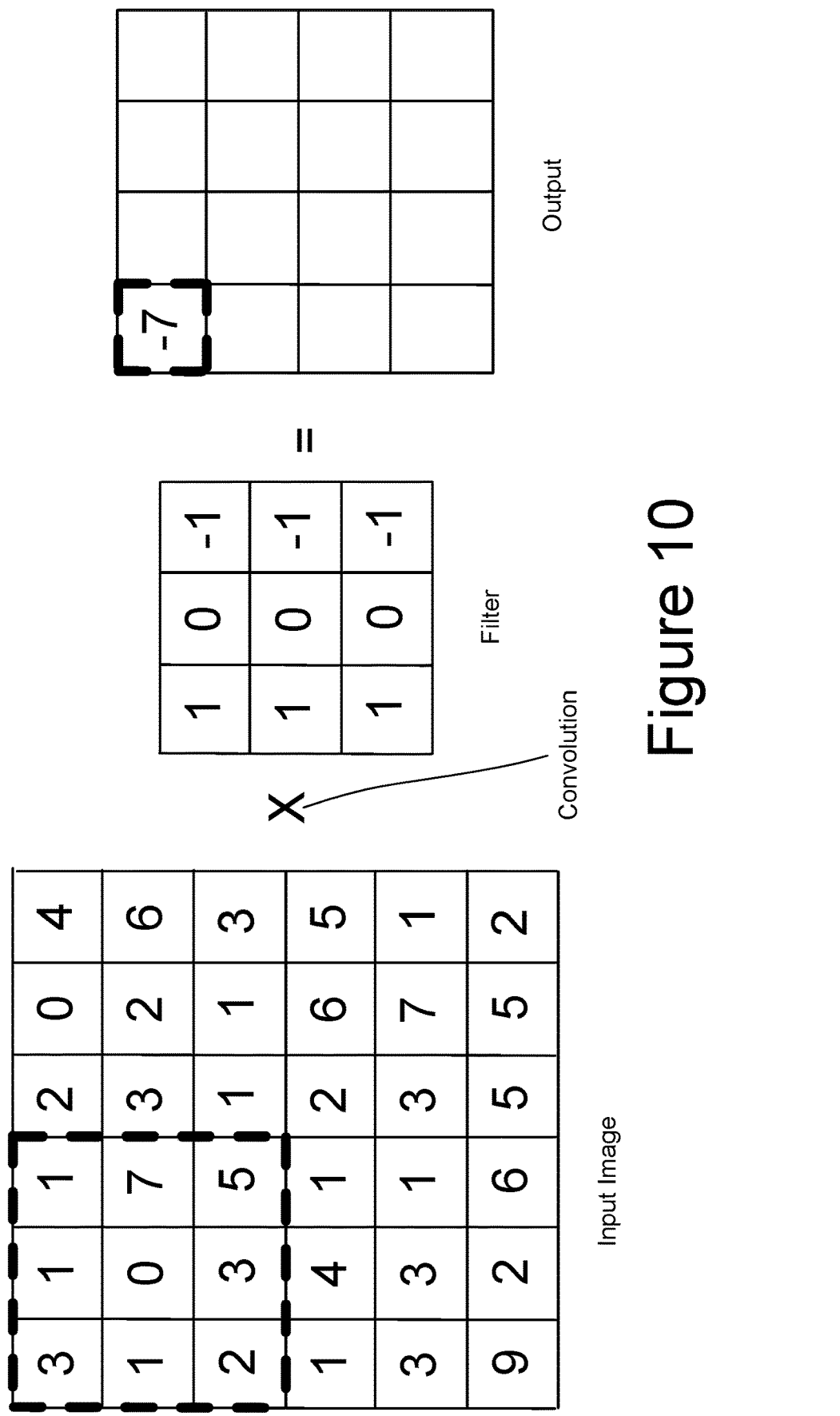
FIG. 10 is a schematic representation of a convolution operation in a convolutional neural network.

FIG. 10 is a schematic representation of a convolution operation between an input image and filter, or set of weights. In this example, the input image is a 6×6 array of pixel values and the filter is a 3×3 array of weights. The convolution operation is performed by a matrix multiplication of the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

Figure 11:
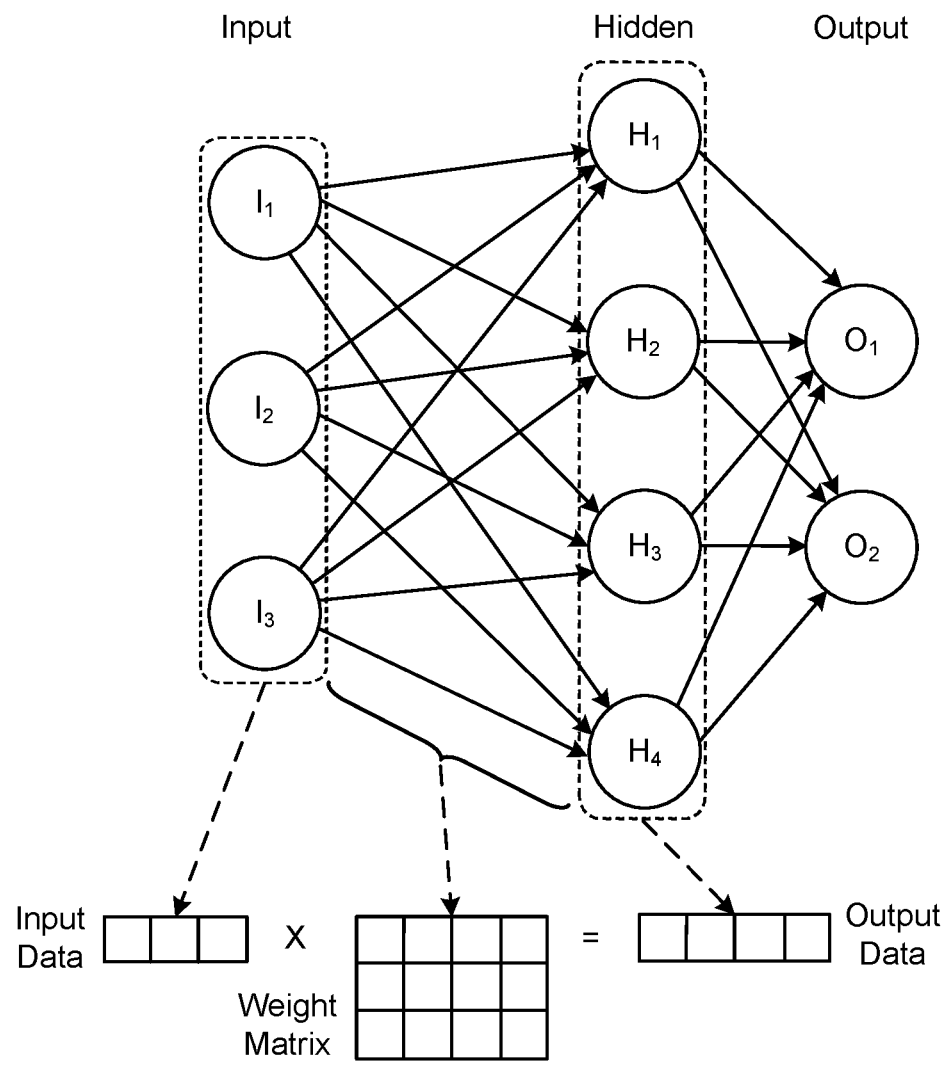
FIG. 11 is a schematic representation of the use of matrix multiplication in a fully connected layer of a neural network.

FIG. 11 is a schematic representation of the use of matrix multiplication in a fully connected layer of a neural network. Matrix multiplication, or MatMul, is a commonly used approach in both the training and inference phases for neural networks and is used in kernel methods for machine learning. FIG. 11 at the top is similar to FIG. 8, where only a single hidden layer is shown between the input layer and the output layer. The input data is represented as a vector of a length corresponding to the number of input nodes. The weights are represented in a weight matrix, where the number of columns corresponds to the number of intermediate nodes in the hidden layer and the number of rows corresponds to the number of input nodes. The output is determined by a matrix multiplication of the input vector and the weight matrix, where each element of the output vector is a dot product of the multiple component vector of the input data with a column of the weight matrix.

A common technique for executing the matrix multiplications is by use of a multiplier-accumulator (MAC, or MAC unit). However, this has a number of issues. Referring back to FIG. 9B, the inference phase loads the neural network weights at step 922 before the matrix multiplications are performed by the propagation at step 923. However, as the amount of data involved can be extremely large, use of a multiplier-accumulator for inferencing has several issues related to the loading of weights. One of these issues is high energy dissipation due to having to use large MAC arrays with the required bit-width. Another issue is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of NAND memory and Storage Class Memory (SCM), such as those based on ReRAM, PCM, FeRAM or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

The following presents embodiments for compute in memory DNNs that can perform the multiplications between input values and weights of an inferencing operation within an array of memory cells by storing the weights for the layers of a neural network in the memory cells and applying inputs for the layers as voltage levels on word lines of the array. The resultant current on the bit lines corresponds to the product of the inputs with weights, where multiple such multiplications can be performed concurrently. To reduce the power consumed by such inference engines, the following discussion presents embodiments based on MRAM type memory cells in an array having a crosspoint structure. Embodiments for the MRAM memory cells have well-separated low and high resistance states, while still having a high resistance value even for the low resistance state, allowing for very low power consumption when inferencing. To store weights of the DNN, the MRAM array is programmed through use of an external magnetic field to assist the on-device programming circuitry.

The use of a crosspoint architecture allows for an array with a smaller footprint in which vector multiplication is implemented by a voltage to current conversion process in which the matrix weights are encoded in the resistance values of the memory cells in the array. The described MRAM cells can have memory window between the low resistance state (LRS) and high resistance state (HRS) with a factor of two or more, while still having a low resistance state whose resistance is still very high, such a $R_{LRS} > 10$ MOhm. To reduce the cost and power consumption typically required for programming circuitry, the use of an external magnetic field programming assistance allows programming without the requirement of on-chip circuitry capable of much higher currents and voltages than what is needed to perform inference. In addition, the programming method allows selection of devices without the need for dedicated select transistors for each bit, reducing the footprint of each bit. As the memory device is used for inferencing, the memory device can preprogrammed with previously determined weight values for a DNN using the eternal magnetic field before being supplied to customers.

More specifically, embodiments are presented for an MRAM-based vector multiplication device that is ultralow power, low cost, and does not require special on-chip programming. The vector multiplication device can include a crosspoint array with an MRAM memory cell at each crosspoint junction and periphery array circuitry capable of supplying independent input voltages to each wire in one plane of wires (i.e., word lines) and reading current on each wire in the other wire plane (i.e., bit lines). The vector multiplication of inputs and weights is performed as a multiplication of the input voltages by the binary or multi-state neural network weights encoded by the MRAM memory cell states. The MRAM memory cells in the crosspoint array can be individually programmed using a combination of input voltages and an external magnetic field, with the discussion below mainly focusing on embodiments where the MRAM memory cell is a voltage-control-of-magnetic-anisotropy (VCMA) MRAM cell. The magnetic coercive field ($H_c$) required to switch VCMA cells depends on the voltage applied to the cell. For one polarity direction $H_c$ decreases monotonically, while for the other polarity direction $H_c$ increases monotonically. The external field is chosen so that an input voltage of one polarity reduces the anisotropy of a memory cell sufficiently to align the cell state with the external field, but is insufficient to align the cell if only half of the input voltage is applied.

This arrangement allows for an improved layout efficiency and lower costs, as the memory cell size can be smaller as no select device or transistor is used. Also, as no special programming circuitry is required, smaller transistors and less complicated circuitry can be used for the control/peripheral elements such as the read/write circuitry. This structure readily extends to a tighter crosspoint pitch, further enabling lower cost and lower power. Since an external field is used to assist in programming the memory cells, very high thermal stability designs can be employed that would not be writable with electrical currents or voltages alone. The high thermal stability of these designs enables small critical dimension (CDs) for memory cells that have adequate retention, allowing for the use of smaller CDs that in turn enable the use of tighter wiring pitches.

MRAM based memory cells often display a high degree of tunability relative to other memory cell technologies. A wide range of low resistance state values can be achieved by tuning the cell resistance-area (RA) product value, without affecting the ratio of high resistance state values to low resistance state values. For example, $R_{LRS}$=10 MΩ and $R_{HRS}$=30 MΩ can be achieved at 20 nm CD with magnetic films that have RA=3000Ω µm² and a tunneling magneresistance ratio (TMR) of 200%. The MRAM structures described here can also display better data retention, higher allowed operating temperatures, longer lifetime, providing superior read endurance and state stability in comparison to other memory technologies.

MRAM memory cells are typically binary devices that are programmed to either a low resistance state or a high resistance state and are typically not operated as having multiple resistance levels per cell, although in alternate embodiments several bits could be integrated at a single junction. The following discussion focuses on binary MRAM memory cells that store either binary valued weights for a neural network or individual bits of multi-bit weight values. The capability of multiple levels per memory cell allows more precise computation per operation in an inference operation, an equivalent precision to multi-level memory cells can be achieved with binary level cells, but more memory cells are required for storing each weight value, thus reducing the number of weights that can stored as multiple MRAM memory cells would be used for each weight value to do n-bit computations. The embodiments discussed below use an inference engine based on a crosspoint array with a binary MRAM memory cell at each junction.

Figure 12A:
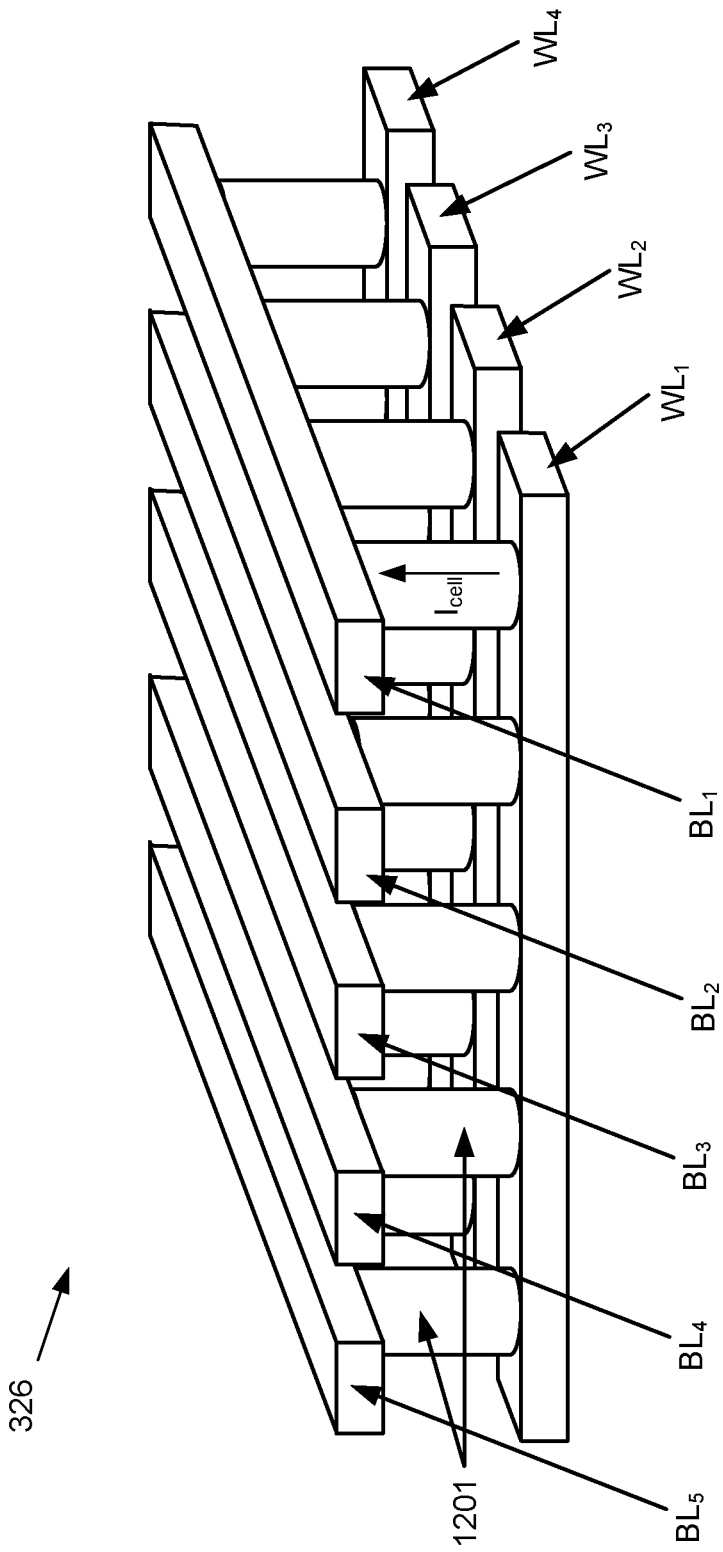
FIGS. 12A-12C depict one embodiment of a portion of a memory array with a cross-point architecture.

FIG. 12A depicts one embodiment of a portion of a memory array 326 that forms a crosspoint architecture in an oblique view. Memory array 326 of FIG. 12A is one example of an implementation for memory array 326 in FIG. 5. The bit lines $BL_1$-$BL_5$ are arranged in a first direction (represented as running into the page) and the word lines $WL_1$-$WL_5$ are arranged in a second direction perpendicular to the first direction. FIG. 12A is an example of a horizontal crosspoint structure in which word lines $WL_1$-$WL_5$ and $BL_1$-$BL_5$ both run in a horizontal direction relative to the substrate, while the memory cells, two of which are indicated at 1201, are oriented so that the current runs in the vertical direction. In a memory array with additional layers of memory cells, there would be corresponding additional layers of bit lines and word lines.

As depicted in FIG. 12A, memory array 326 includes a plurality of memory cells 1201. The memory cells 1201 may include re-writeable memory cells, such as can be implemented using ReRAM, MRAM, PCM, or other material with a programmable resistance. The following discussion will focus on MRAM memory cells, although much of the discussion can be applied more generally. The current in the memory cells of the first memory level may flow upward as indicated by arrow $I_{cell}$.

Figure 12B:
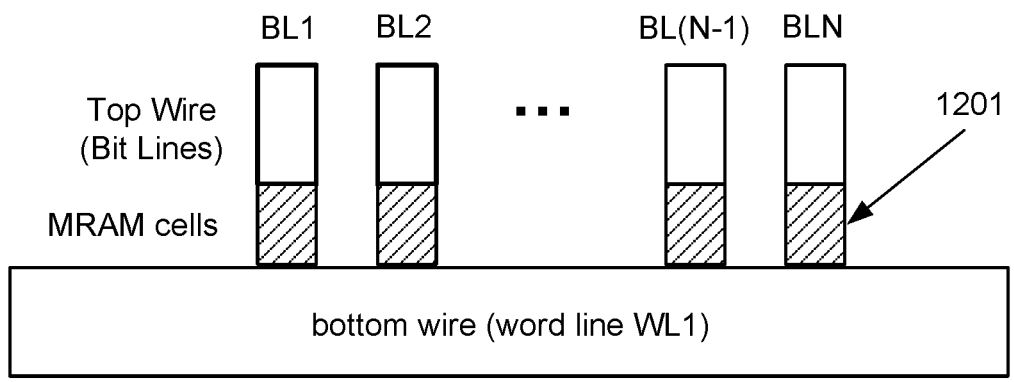
Figure 12C:
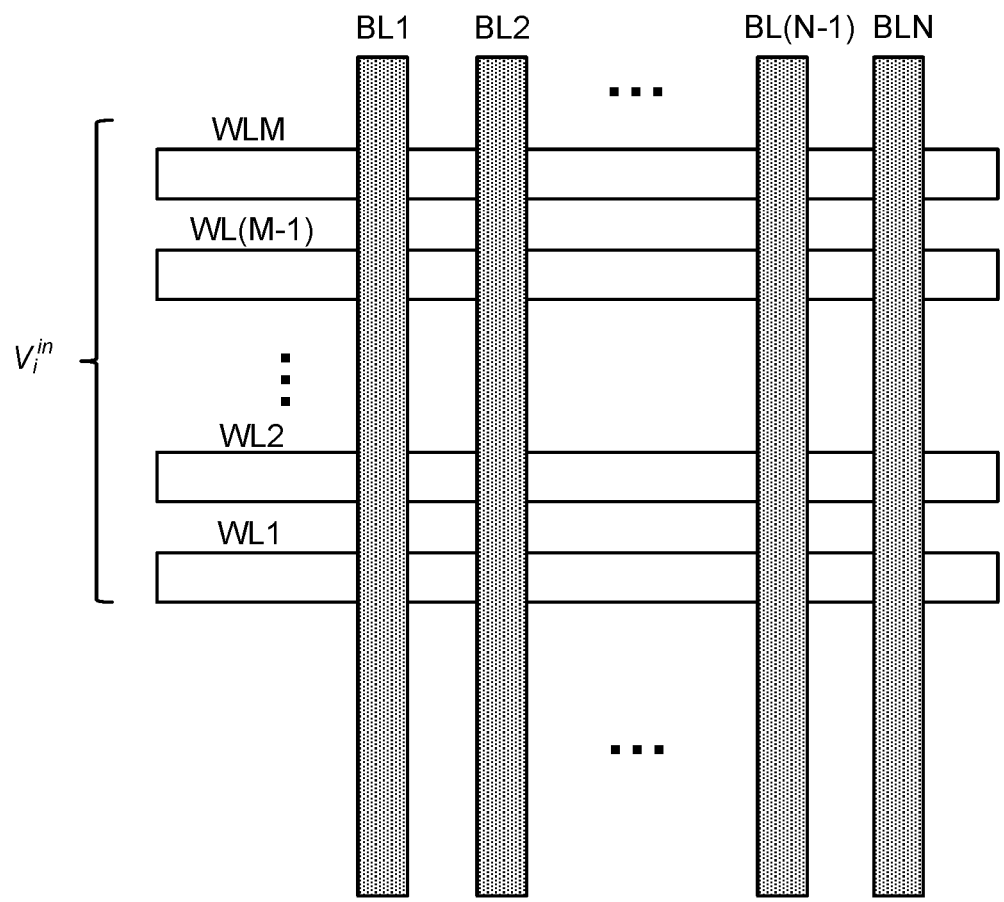

FIGS. 12B and 12C respectively present side and top views of the crosspoint structure in FIG. 12A. The sideview of FIG. 12B shows one bottom wire, or word line, $WL_1$ and the top wires, or bit lines, $BL_1$-$BL_n$. At the crosspoint between each top wire and bottom wire is an MRAM memory cell 1201. FIG. 12C is a top view illustrating the crosspoint structure for M bottom wires $WL_1$-$WL_M$ and N top wires $BL_1$-$BL_N$. In a binary embodiment, the MRAM cell at each crosspoint can be programmed into one of two resistance states: high and low. More detail on embodiments for an MRAM memory cell design and techniques for their programming are given below.

The array structure of FIGS. 12A-12C can be used to perform an in-array multiplication of an inferencing operation in which the matrix weights for the layers of a neural work are stored in the memory cells as their electrical resistance. Applying the voltage vector $V_i^{in}$ to the inputs of the word lines generates a current in the output of the bit lines that corresponds to a vector multiplication of the input voltages with the binary weights encoded by the MRAM cell resistances. The weights are encoded as conductances $b_{i,j}$, which is the inverse of a resistance $R_{i,j}$ of the memory cell at the cross point of word line $WL_i$ and bit line $BL_j$:

$$b_{i,j} = \frac{1}{R_{i,j}}. \qquad \text{(Equation 1)}$$

If the input for the layer of the neural network is encoded as voltages $V_i^{in}$ applied to the respective word lines $WL_i$, then the current on each bit line $BL_j$ will be the product:

$$I_j^{out} = \Sigma b_{i,j} * V_i^{in}, \qquad \text{(Equation 2)}$$

where the sum is over i. By concurrently performing a sensing operation on multiple selected word lines, the crosspoint structure will automatically compute the input-weight product for the layer.

Note that under this arrangement, multiple memory cells along a bit line are concurrently selected for sensing, with the corresponding input voltage applied on their corresponding word lines. The current $I_j^{out}$ corresponds to the combined result for all of these memory cells and this process consequently differs from normal read operation in which the state of an individual memory cell along a bit line is determined. The $I_j^{out}$ of such an inference operation is the combined result of multiple memory cells along the bit line and the contribution of the individual memory cells would not be known.

Figure 13:
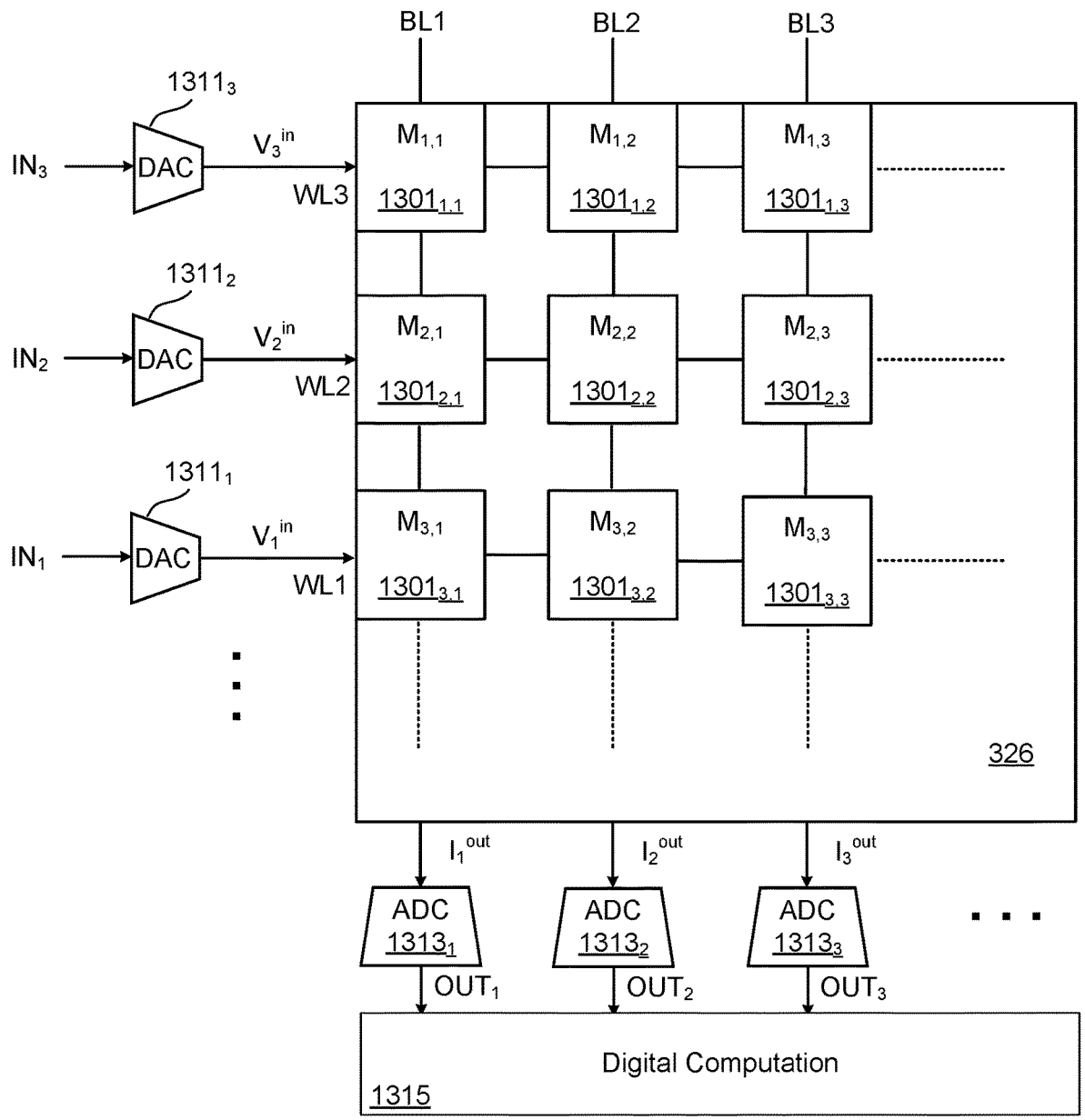
FIG. 13 is a top view of the crosspoint array and some of the control circuits used in operating the array.

FIG. 13 is a top view of the crosspoint array and some of the control circuits used in operating the array, where a 3×3 section of the array is shown. At the crosspoint of each word line $WL_i$ and bit line $BL_j$ is an MRAM memory cell $M_{i,j}$ $1301_{i,j}$. The inputs $IN_i$ for a layer of the neural network are converted from input values to voltage levels in the digital to analog converters (DACs) $1311_i$ to a corresponding voltage level. The inputs $IN_i$ for a layer can be the initial input for the network or the output of a preceding layer. In a binary embodiment, a 1 input can be converted into a high read voltage $V_{read}$ and a 0 input can be converted into a low read voltage, such as 0V or ground, in which case the DACs $1311_i$ can be one bit DACs. The analog currents $I_j^{out}$ on each of the bit lines $BL_j$ are converted into a digital value in the corresponding analog to digital converter ADC $1313_j$ to generate a multi-bit digital output $OUT_j$. The output values $OUT_j$ can then go to a digital computation block 1315, which can perform operations such as accumulations for multiply and accumulation operations, apply activation functions to the outputs, and other such operations performed as part of propagating an input through a neural network. Referring back to FIGS. 5 and 6A, the DACs $1311_i$, ADCs $1313_j$ and digital computation block circuit 1315 can be considered part of the row decoder 324, column decoder 332, and read/write circuits 328, along with components of the control circuitry of 310. The DAC and/or ADC can be multi-bit devices, capable of generating or outputting signals quantized in $2^n$ levels, with n>1.

Considering the writing of data (i.e., weight values) to the array, embodiments presented here use an external magnetic field assist for the electrical programming of the MRAM memory cells. More specifically, programming occurs through a combination of electrical voltages and external magnetic fields. The electrical selection of the memory cells selected to be written is done using a half-select scheme, as illustrated with respect to FIG. 14A.

Figure 14A:
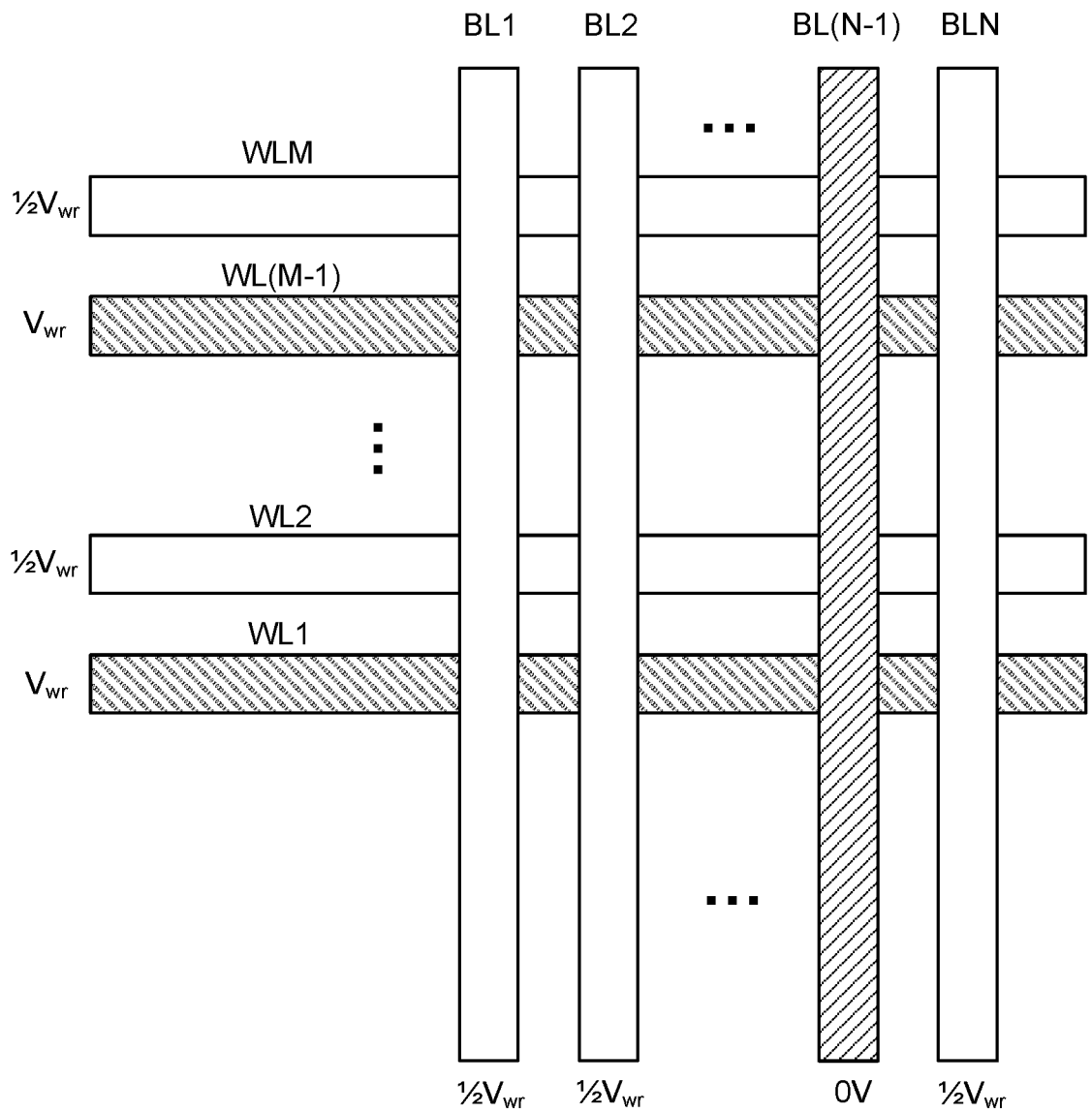
FIG. 14A illustrates a half-select scheme for selection of memory cells to be programmed.

FIG. 14A illustrates a half-select scheme for selection of memory cells to be programmed. Voltages are applied to the top (bit lines) and bottom (word line) wires so that cells along a bit line that are intended to be written have a write select voltage $V_{wr}$ applied across the memory cell between the bottom and top wires. Memory cells that are not to be written experience either only half of the voltage drop ($V_{wr}/2$) or no voltage drop. In the example of FIG. 14A, the two cells at intersection of bit line $BL_{(N-1)}$ and word lines $WL_1$ and $WL_{(M-1)}$ are selected for writing, with write voltage $V_{wr}$ applied on the selected word lines and 0V (or, more generally, a lower voltage level) on the selected bit line. The other word lines and bit lines are set to $\frac{1}{2}V_{wr}$ (or, more generally, some other voltage level intermediate to the write voltage $V_{wr}$ and low voltage level on the selected word line such that non-selected memory cells are not programmed). This places a differential of $V_{wr}$ across the selected memory cells and either $V_{wr}$ or $\frac{1}{2}V_{wr}$ across non-selected memory cells. The programming can be done on a bit line by bit line process, as discussed in more detail below.

Figure 14B:
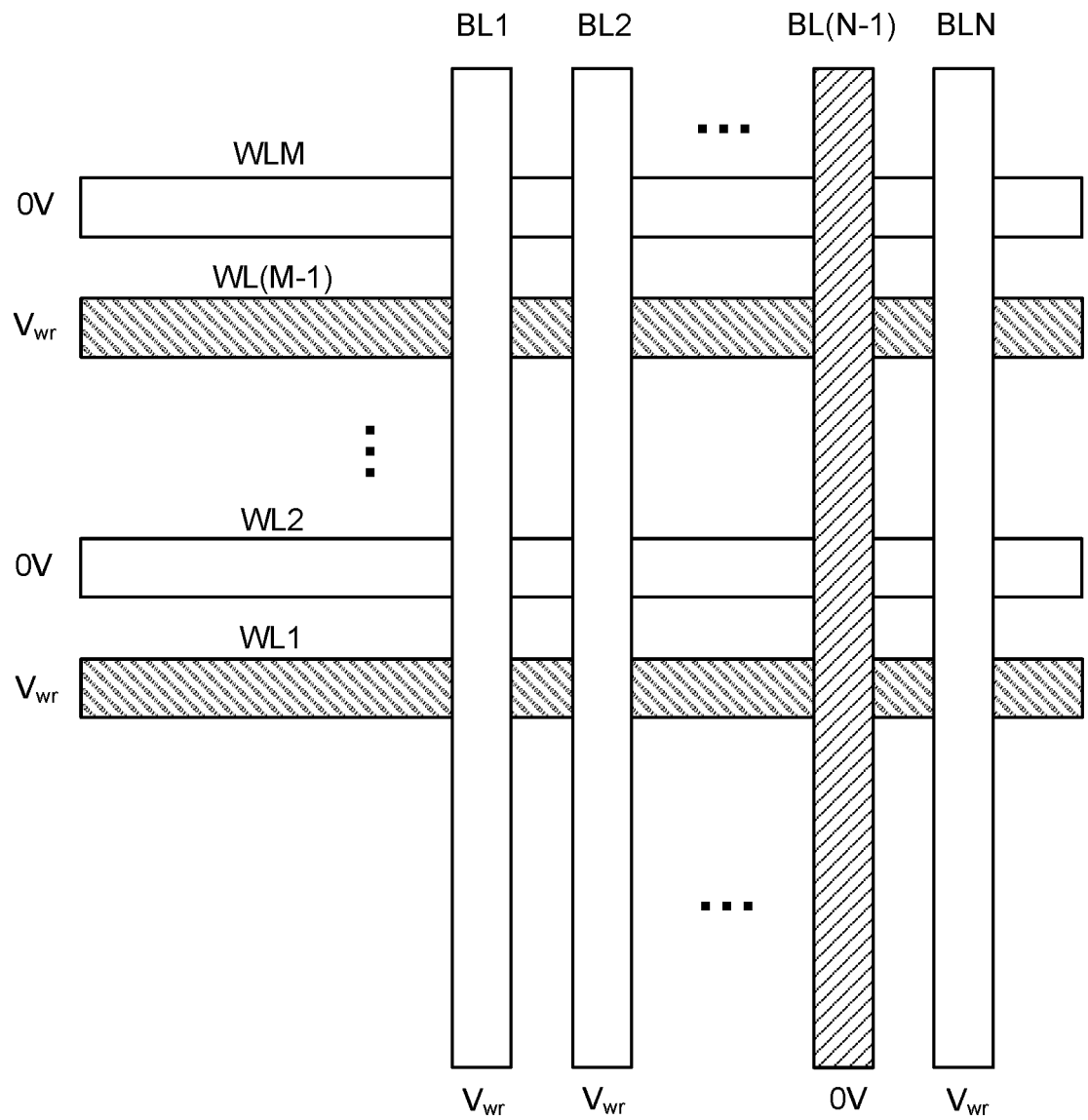
FIG. 14B illustrates a "full-select" scheme for selection of memory cells to be programmed.

In the embodiment of FIG. 14A, both the non-selected word lines and the non-selected bit lines are set to a voltage intermediate to the $V_{wr}$ applied to the selected word lines and the low voltage of 0V applied to the selected bit line. In particular, $\frac{1}{2}V_{wr}$ is applied to all non-selected bit lines and word lines. However, other embodiments can use different values, using another value lower than $V_{wr}$ for non-selected word lines and another value greater than 0V for the non-selected bit lines. FIG. 14B provides an example of an alternate embodiment for biasing of the array for programming.

FIG. 14B illustrates a "full-select" scheme for selection of memory cells to be programmed. As used here, in the full select programming scheme again biases the selected word lines to $V_{wr}$ and the selected bit lines to 0V; but now the non-selected word lines are set to 0V and the non-selected bit lines are set to $V_{wr}$. Under this biasing arrangement, the non-selected memory cells are stabilized and the half-selected memory cells have no voltage applied across them, rather than the $\frac{1}{2}V_{wr}$ applied in the half-select scheme which provides much more programming head-room. More generally, the non-selected word lines can be set to another voltage less than $V_{wr}$ and the non-selected bit-lines can be set to another voltage higher than 0V, but the use of $0V/V_{wr}$ for the non-selected word/bit lines can help to simplify the biasing circuitry involved.

In the embodiments mainly described here, an external magnetic field is used to assist electrical programming of the MRAM cells. The MRAM cells are designed to be capable of having their switching field reduced via the voltage control of magnetic anisotropy (VCMA) effect. This is illustrated with respect to FIGS. 15, 16A, and 16B.

Figure 15:
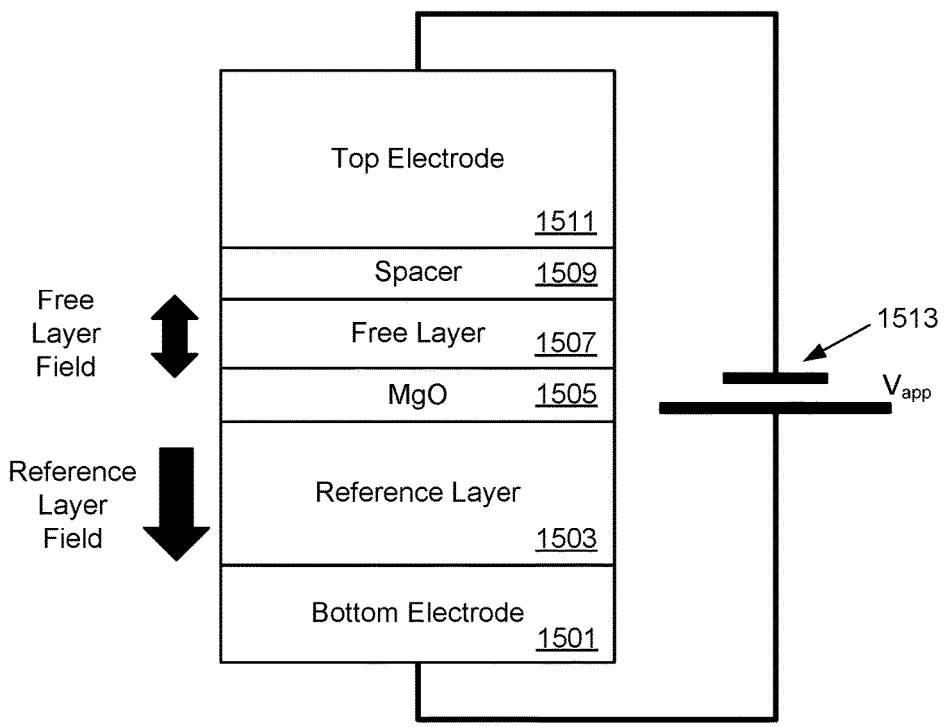
FIGS. 15, 16A, and 16B illustrate an example of an MRAM memory cell and the impact of voltage on the magnetic field required to switch the free layer of an MRAM memory cell.
Figure 16A:
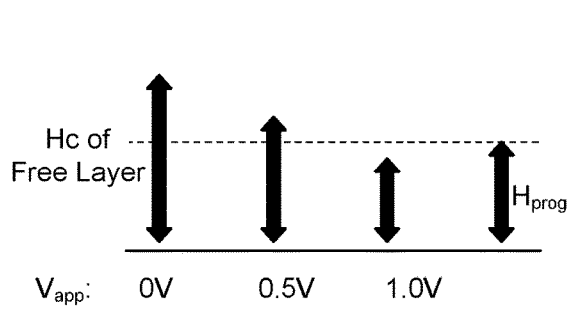
Figure 16B:
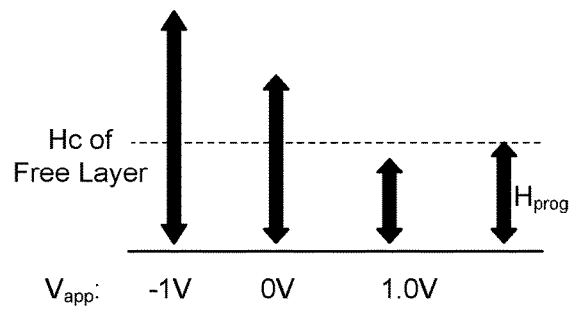

FIGS. 15, 16A, and 16B illustrate an example of an MRAM memory cell and the impact of voltage on the magnetic field ($H_c$) required to switch the free layer of the MRAM memory cell. More specifically, FIG. 15 illustrates an embodiment for the structure of an MRAM memory cell. A voltage being applied across the memory cell, between the memory cell's corresponding word line and bit line, is represented as a voltage source $V_{app}$ 1513. The memory cell includes a bottom electrode 1501, a pair of magnetic layers (reference layer 1503 and free layer 1507) separated by a separation or tunneling layer of, in this example, magnesium oxide (MgO) 1505, and then a top electrode 1511 separated from the free layer 1507 by a spacer 1509. The state of the memory cell is based on the relative orientation of the magnetizations of the reference layer 1503 and the free layer 1507: if the two layers are magnetized in the same direction, the memory cell will be in a low resistance state (LRS); and if they have the opposite orientation, the memory cell will be in a high resistance state (HRS). The orientation of the reference layer 1503 is fixed and, in the example of FIG. 15, is oriented downward. Data is written to the memory cell by programming the free layer 1507 to either have the same orientation or opposite orientation. Commonly, an array of MRAM memory cells is placed in an initial, or erased, state by setting all of the MRAM memory cells to be in the low resistance state in which all of their free layers have a magnetic field orientation that is the same as the their reference layers. Each of the memory cells is then selectively programmed by placing its free layer 1507 to be in the high resistance state by reversing the magnetic field to be opposite that of the reference layer 1503. The reference layer 1503 is formed so that it will maintain its orientation when programming the free layer 1507. The reference layer 1503 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

FIG. 16A illustrates how the level of the applied voltage $V_{app}$ affects the magnetic field $H_c$ as seen by the free layer 1507 relative to the level of an external magnetic field $H_{prog}$ used to assist in programming in the half-selected embodiment of FIG. 14A. When there is no applied voltage, the magnetic field $H_c$ of the free layer 1507 will be high (~2 kOe, for example). When 1V, for example, is applied from the reference layer 1503 to the free layer 1507 side of the MRAM cell, the $H_c$ is reduced (e.g., ~2 kOe→~1 kOe). Cells that have only 0.5V applied (i.e., half selected cells) have $H_c$ reduced less than the selected cells (e.g., ~2 kOe→~1.5 kOe). The selected cells are written with the assistance of an external magnetic field, where the external magnetic field $H_{prog}$ applied is selected such that it is above a level capable of setting the magnetization of the selected cells, but not above a level that would reverse the state of the half-selected cells: for example, with the values described above this could be an external field of $H_{prog}=+/-1.25$ kOe, which is higher that $H_c$ value of the free layer 1507 of a selected memory cell biased to 1V, but less than that of a half-selected (at 0.5V) or non-selected memory cell (at 0V).

FIG. 16B illustrates how the level of the applied voltage $V_{app}$ in the full-select embodiment affects the magnetic field $H_c$ as seen by the free layer 1507 relative to the level of an external magnetic field $H_{prog}$ used to assist in programming in the half-selected embodiment of FIG. 14B. A selected memory cell will be biased at 1V as in FIG. 16A so that it will again program in response to the external magnetic field $H_{prog}$. For a half-selected memory cell, where the one of the word line or bit line is selected, but the other is not, there will be 0V applied across the memory cell. Relative to the embodiment of FIG. 16A, where a half-selected memory cell sees 0.5V, this provide a better margin. For a fully non-selected memory cell, where the word line is at 0V and the bit line at $V_{wr}$, the memory cell will see a relative voltage of −1V (where $V_{wr}$ is taken as 1V). As can be seen by comparing FIG. 16A to 16B, the full-select embodiment provides improved programming margin for non-selected memory cells in both the half-selected case and the fully non-selected case. Although this places a voltage across the (fully) non-selected selected memory cells that can induce a current, as the embodiments presented here can have very high resistance levels for both the low- and high-resistance states, the magnitude of this current can be quite small and an acceptable trade-off for the improved programming margin.

Figure 17:
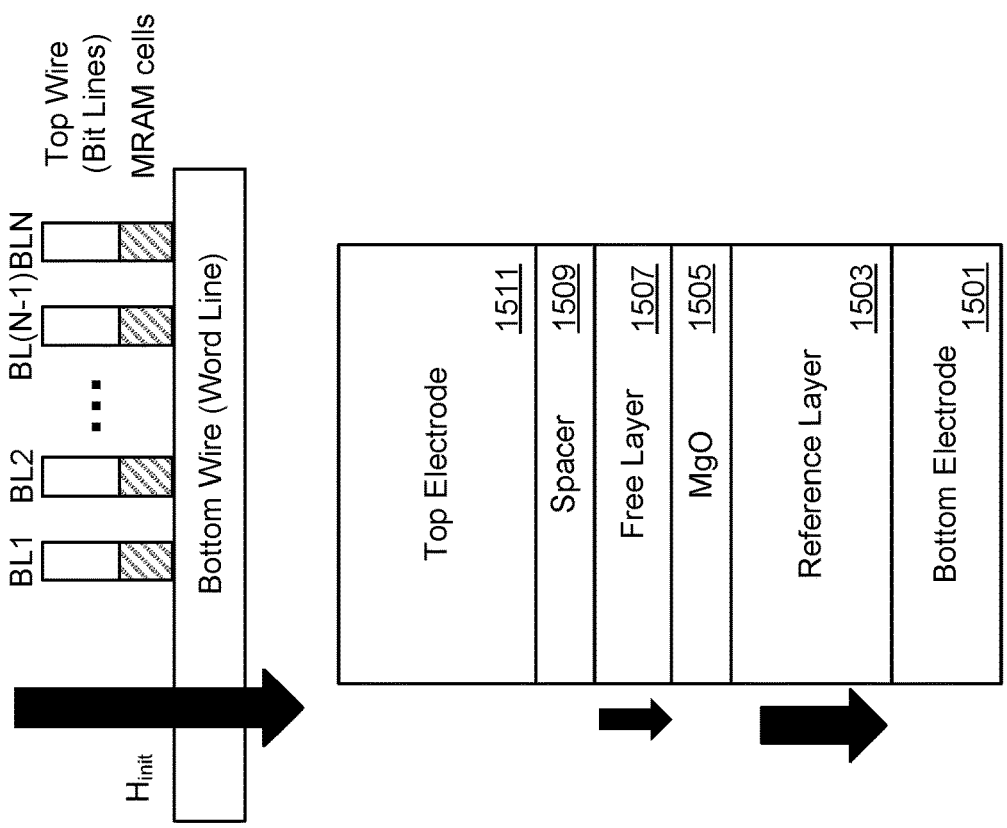

FIGS. 17-19B illustrate an embodiment for the programming of the MRAM crosspoint array assisted by an external magnetic field in more detail. Prior to programming the weights into the memory cells, all of the memory cells in the array are initialized to the same polarity using a large external magnetic field $H_{init}$. This is illustrated in FIG. 17. As represented to the right side of the top part of FIG. 17, a relatively large amplitude external magnetic field $H_{init}$ is oriented downward (from top electrode towards bottom electrode). The field $H_{init}$ should be sufficient to align the reference layer and free layer along the same axis, as illustrated by the MRAM memory cell in the lower part of FIG. 17. In this example all the cells are initialized to the parallel (P) state, which can represent binary 1.

Figure 18:
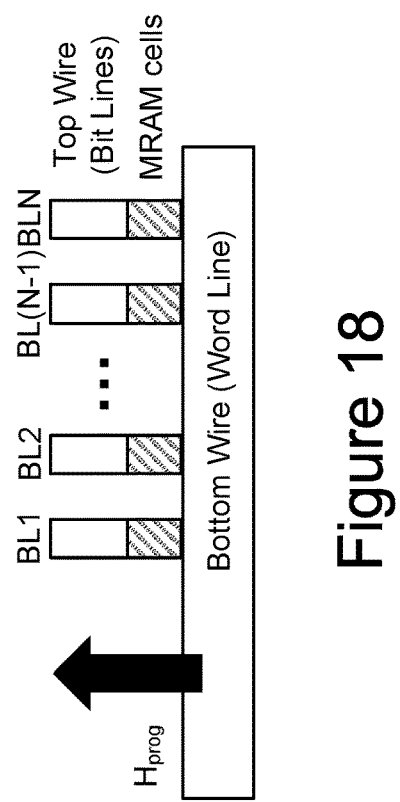
FIGS. 17-19B illustrate an embodiment for the programming of the MRAM crosspoint array assisted by an external magnetic field in more detail.

After initialization, a second magnetic field ($H_{prog}$) is applied with opposite polarity to $H_{init}$, as illustrated in FIG. 18. $H_{prog}$ is chosen so that cells with the voltage difference of $V_{wr}$ applied will flip from the P to the high resistance anti-parallel (AP) state that can represent binary 0, but cells with $V_{wr}/2$, as in the half-select embodiment, and less, as in the full-select embodiment, applied remain in the low resistance P state.

Figure 19A:
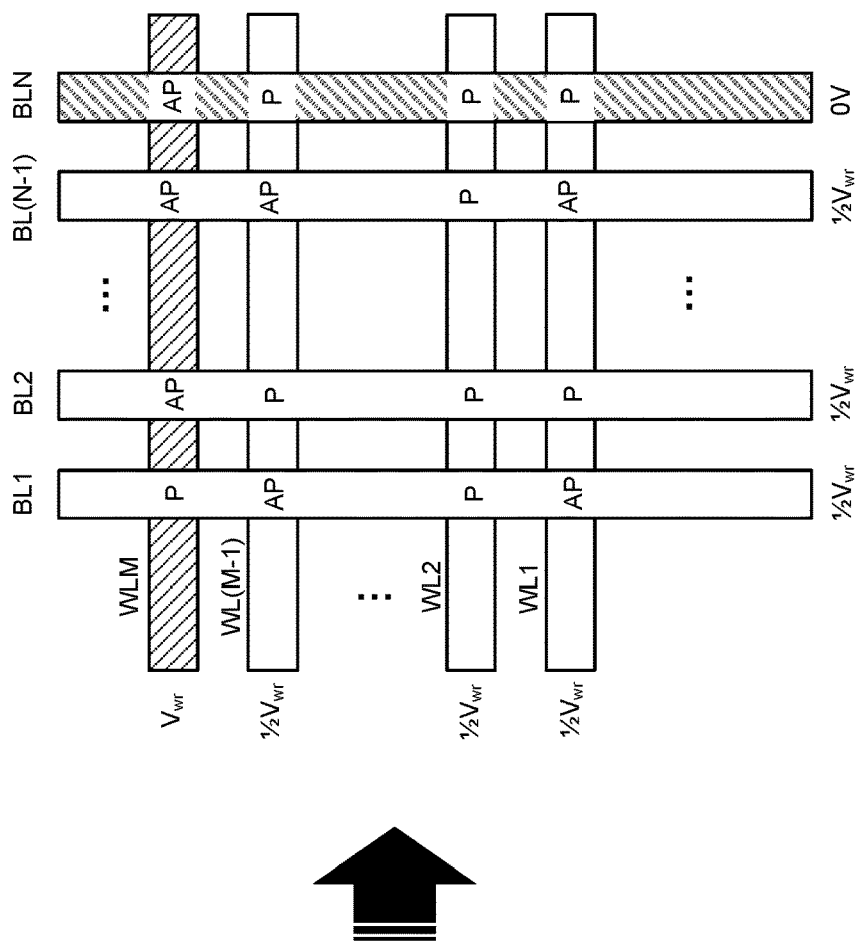
Figure 19A:
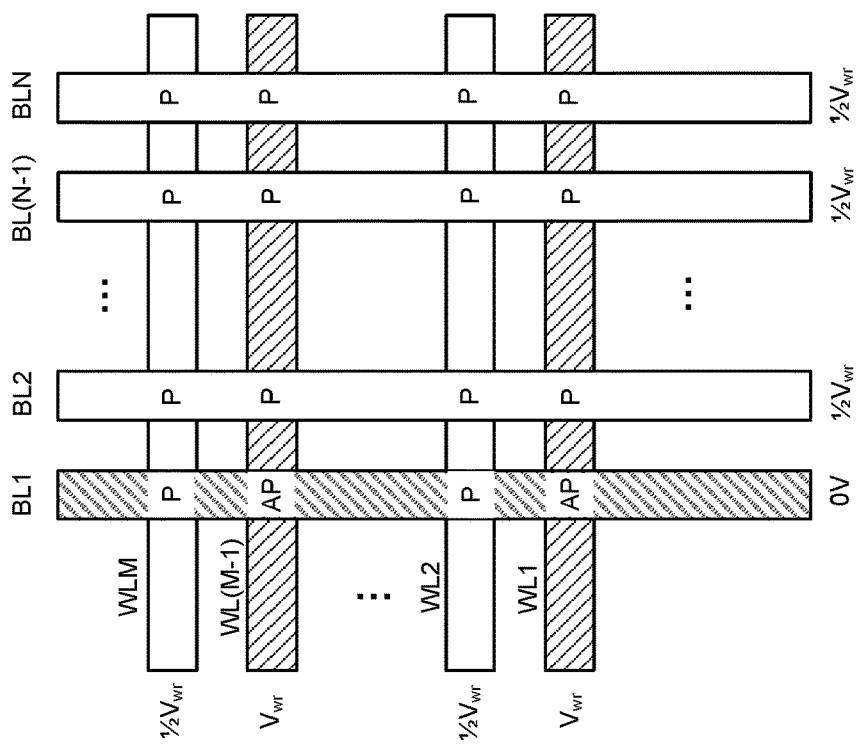

With the external magnetic field $H_{prog}$ applied, the array can be programmed, such as by programming each bit line in the array in sequence, such as illustrated for a half-selected embodiment in FIG. 19A showing the bit lines being written starting at $BL_0$ and progressing sequentially to $BL_N$. As notated in FIG. 19A, the initial parallel state is labelled P and the memory cells to be programmed to an anti-parallel state are labelled AP. The bit line to be programmed is selected by being grounded, while all other bit lines are set at $V_{wr}/2$. The cells to be flipped to AP on the bit line are selected by applying $V_{wr}$ to the respective word lines, while setting all other word lines at $V_{wr}/2$. For example, at left in FIG. 19A the memory cells on bit line $BL_1$ and word lines $WL_2$ and $WL_M$ are selected to be written; and at right in FIG. 19A the memory cell on bit line $BL_N$ and word line $WL_1$ is selected to be written. Without the external magnetic field $H_{prog}$, the biasing on the selected memory cells will not be sufficient to induce programming, and without the biasing, the external field $H_{prog}$ will not be sufficient to induce programming.

Figure 19B:
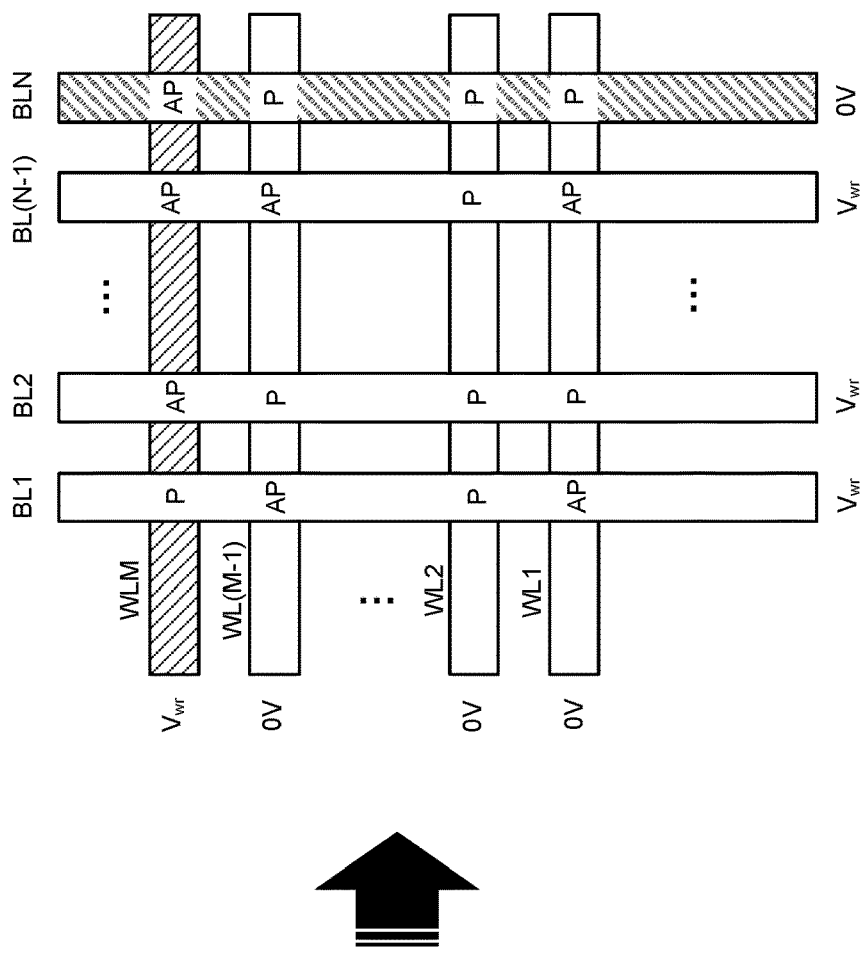
Figure 19B:
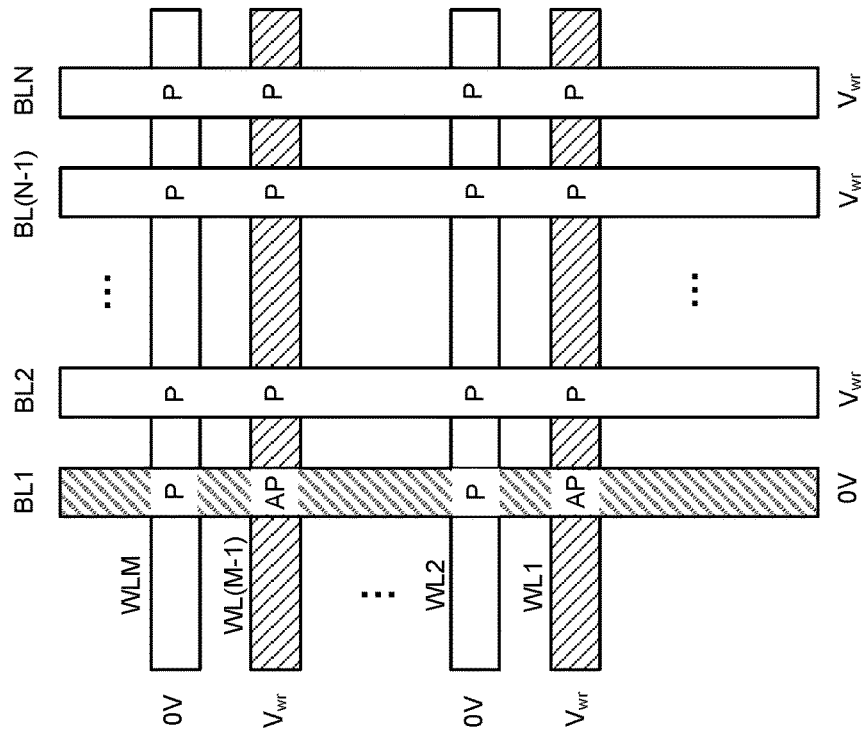

FIG. 19B illustrated an embodiment for a programming sequence as in FIG. 19A, but for a full-select embodiment. As before, the selected bit line is again at 0V and any word lines to be programmed for this bit line are again set at $V_{wr}$. Now, however, the non-selected word lines are now set at 0V and the non-selected bit lines are at $V_{wr}$. This will again bias the selected memory cell along the selected bit line so that they will again be programmed; but the non-selected memory cells will be biased with an improved margin as described above with respect to FIG. 16B. FIG. 19B shows the same selected memory cells as in FIG. 19A for bit line $BL_1$ and $BL_N$ in an embodiment where the programming progresses sequentially from $BL_1$ to $BL_N$.

Referring back to FIGS. 5 and 6A, the control circuitry involved in the reading and writing of the memory cells can be part of the row decoder 324, column decoder 332, and read/write circuits 328, along with components of the control circuitry of 310, such as the state machine 312. During a write operation, drivers/biasing circuitry within the row decoder 324 and column decoder 332 can bias the word lines and bit lines as illustrated with respect to FIGS. 19A and 19B so that the MRAM memory cells individually selected for programming are biased so that they are programmed when an external magnetic field in a range that above a first value for the external magnetic field is high enough to a change the state of selected memory cells, but below a second value for the external magnetic field that is not so high as to induce a change of state in non-selected and half-selected memory cells, resulting in a reset of the entire array. The use of the external magnetic field for programming allows for lower voltages to be used relative to other techniques of operating MRAM memory cells or than are typically used for other memory cell technologies. These lower voltage levels can improve power usage and save on layout space as smaller devices can be used in the circuitry and components need to generate and supply higher voltages, such as charge pumps and regulators, can be avoided.

With respect to the reading of data in an inferencing operation, as described with respect to FIGS. 12C, rather than determine the data state of individual memory cells, the biasing circuitry within the row decoder 324 converts an input vector for a layer of the network into a set of $V^{in}$ values that are concurrently applied to the word lines of the selected set of memory cells. The column decoder 332 and read/write circuits 328, including the sense amplifiers 350, will determine the total $I^{out}$ along each of the word lines as a multi-bit sensing operation to indicate the product of the input vector with the weight values stored along the corresponding bit line. As the MRAM memory cells described here have a high resistance value even in the low resistance (i.e., parallel) state, even when concurrently sensing multiple memory cells the current values can still be comparatively low and the inferencing process a low power process. The control circuitry on the memory device can then accumulate the multiplication results as part of a multiply and accumulate operation to determine an output for the neural network's layer, which can either be an input to a subsequent layer or an output for the network.

A number of alternate embodiments can incorporate additional features. For example, the initialization process described with respect to FIG. 17 can be performed with voltage assistance. As described above, if $H_{init}$ is larger the value of Hc when the voltage applied across the memory cells $V_{app}=0$, then no voltage needs to be applied to the bit lines or word lines for initialization. Alternatively, a positive voltage can be applied to all of the word lines and the bit lines can be grounded, reducing the magnitude of the field that needs to be applied to initialize all the bits, similarly to the process illustrated with respect to FIGS. 16A and 16B, now with all of the memory cells of the array selected.

In other alternate embodiments, additional programming passes can be used to fix incorrectly or under programmed bits. In such an embodiment, programming errors can be corrected by additional programming passes. As noted above, for implementation as an inference engine multiple memory cells along a shared word line are sensed concurrently. In such an implementation, programming errors can be detected by testing the function of the array under different input voltages patterns. The potential errors can be bits that have inadvertently flipped from P to AP during programming (or "weak bits") or bits that did not flip from P to AP during programming (or "hard bits"). Weak bits can be programmed by applying a voltage programming sequence selecting the erroneous bits, but with the external magnetic programming field set to the same polarity as $H_{init}$. Hard bits can be programmed by applying the limited programming sequence with either a larger external magnetic field, larger voltage, or both.

Although the preceding discussion has been presented in terms of specific embodiments, they are more generally applicable. For example, although the preceding discussion is mainly described with respect to MRAM memory cells in which the primary switching mechanism is VCMA, the techniques can also be applied to spin-transfer torque implementations. In other variations, multiple bits per cell can be employed by stacking multiple MRAM memory cells at each crosspoint junction. In a multi-bit embodiment, each cell should have a sufficiently different Hc value so that they can be written in sequence by first writing the higher Hc layer and then progressively writing the lower Hc layers.

Figure 20:
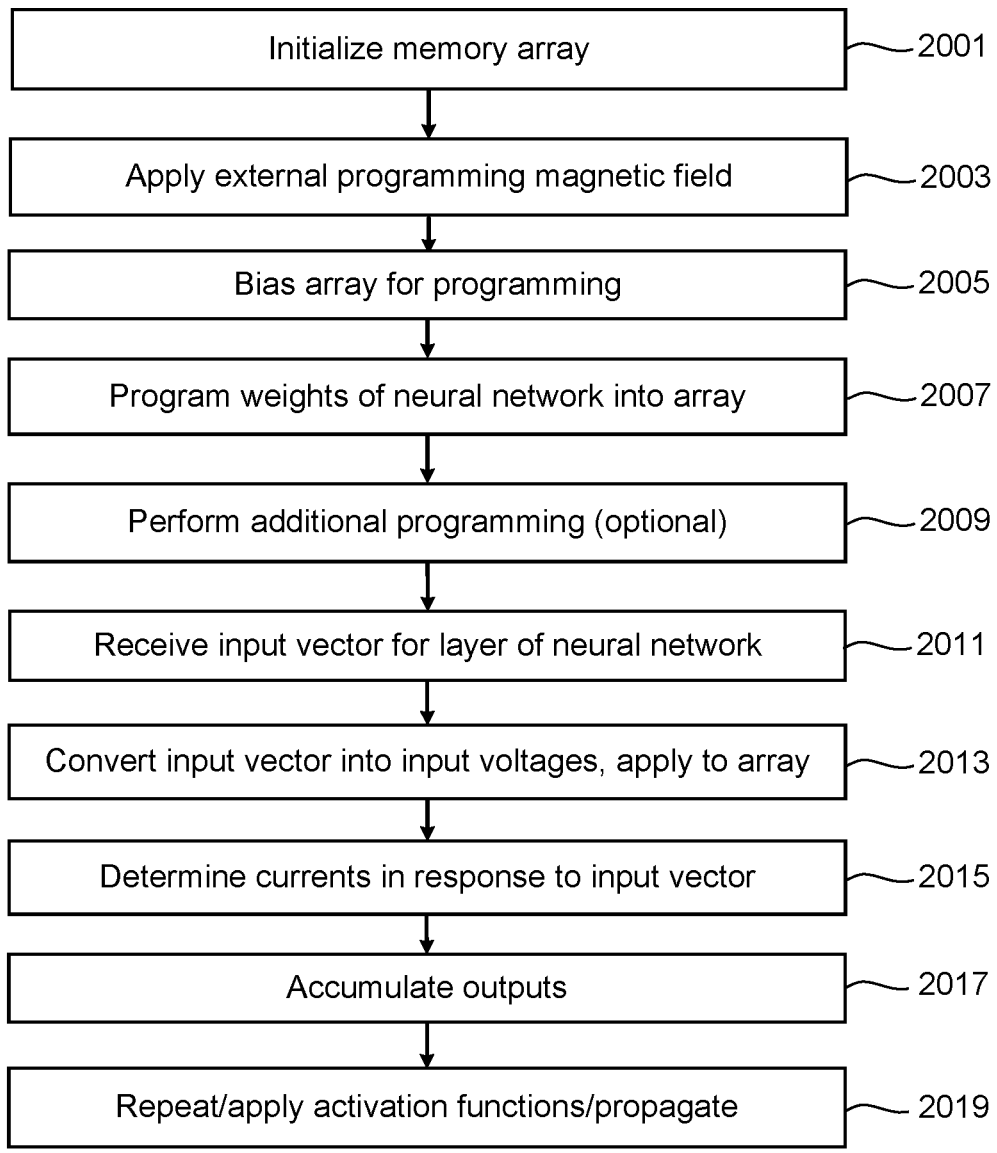
FIG. 20 is a flowchart illustrating an embodiment for the use of an MRAM based memory with a crosspoint architecture for an inference engine.

FIG. 20 is a flowchart illustrating an embodiment for the use of an MRAM based memory with a crosspoint architecture for an inference engine. The flow of FIG. 20 includes both an embodiment of a method for programming the MRAM crosspoint memory array (steps 2001-2009) and the subsequent use of the memory array for inferencing (2011-2019). Although the description is given here in the context of an inference engine for a neural network since the described structures and techniques can be of particular utility in such applications, they can be more generally applied since low power non-volatile memory with high data retention can be used in many contexts.

Beginning at step 2001, if the memory array is not already initialized or needs to be re-initialized to erase previously written data, an initialization is performed. As described with respect to FIG. 17, the die with the memory array is placed in a magnetic field $H_{init}$ sufficiently strong to align both the free layer 1507 and also the reference layer 1503. The initialization can either be performed without a voltage applied across the MRAM memory cells (such as by setting the word lines and bit lines ground or leaving them unbiased) or, in alternate embodiments, a voltage can be applied across all of the memory cells (such as by biasing all of the word lines to $V_{wr}$ and all of the bit lines to 0V) to use the phenomenon described with respect to FIGS. 16A and 16B to assist the initialization process.

To selectively write the individual memory cells with data, such as the weights of a layer of neural network, at step 2003 the memory die with the array is placed in an external magnetic field $H_{prog}$ as illustrated in FIG. 18, where $H_{prog}$ will have the opposite polarity and a lower field strength relative to $H_{init}$. While in the external magnetic field $H_{prog}$ the memory array is then biased at step 2005 and, as a result, programmed at step 2007. The biasing can be as illustrated FIG. 14A to use the phenomenon illustrated FIG. 16A to program the selected memory cells, or can be as illustrated for a full-select embodiment in FIG. 14B to use the phenomenon illustrated FIG. 16B to program the selected memory cells. By applying a voltage $V_{wr}$ (1V in the example) to selected word lines, 0V to selected bit lines, and setting the non-selected word lines and bit lines to $\frac{1}{2}V_{wr}$ (in the half-select embodiment) or respectively to 0V and $V_{wr}$ (in a full-select embodiment), the magnetic field of the free layer 1507 $H_c$ is lowered below $H_{prog}$ and the free layer 1507 of the selected memory cells will be flipped to be in a high resistance, anti-parallel state. The programming can proceed in a bit line by bit line fashion, as illustrated in FIG. 19A.

In some embodiments, at step 2009 one or more additional programming passes can be performed to correct incorrectly programmed memory cells. As discussed above, this can be done to correct both hard bit errors and soft bit errors. In some embodiments, such as inference engine, where all of the word lines or a sub-set of multiple word lines are sensed concurrently, the programmed data can be checked by sequentially applying an appropriate set of input data patterns to verify the preceding programming.

As the initialization and programming of data use the assist of external magnetic fields, and the strength of these magnetic fields are typically quite large (such as the external $H_{prog}$ of around 1.25 kOe in the example above), these processes would typically be done prior to being provided to the end user. For example, the memory array can be initialized and programmed by the manufacturer prior to shipping, such as at the end of the testing processes that are commonly performed on fresh devices. Alternately, the memory array could be programmed by an intermediate party before being supplied to the end user: for example, the unprogrammed memory array (either initialized or not) could be provided to an original equipment manufacturer (OEM), who could then program their data (such as weights for a DNN), and then supply a product that incorporates the programmed array to the OEM's customer. This would be the case of, for example, an autonomous vehicle that relied upon neural networks and where the vehicle manufacturer would program the weights of their neural network models into the arrays before the vehicle is provided to the end operator.

Steps 2011-2019 consider when the memory array is used as an inferencing engine. A deep neural network can have large numbers layers and the weights for each of these layer can be stored in one or more arrays of the MRAM crosspoint type described above, where each memory die can have one or more such arrays. To propagate an initial input through the layers of the DNN, the initial input vector is applied to the weights of the first layer, with the output of the first layer serving input to the next layer, and so on through remaining layers until the final output is achieved. The process can be controlled by one or more control circuits including the on-die control circuitry 310 and other elements discussed above with respect to FIGS. 5 and 6A, by the memory system controller 102 (FIG. 1), or control circuitry at the level of the memory package (104). For example, the inferencing operations, such as multiply and accumulate operations for the arrays on a die and propagation within a die can be handled on the memory die, and the higher level processing and transfers between dies overseen by the memory controller.

Considering the inferencing for a given layer, at step 2011 an input for the layer is received. This can be the output from a preceding layer or an initial input of the neural network, depending on the location of the layer within the network. At step 2013 the input vector is converted to a corresponding set of word line voltages and applied to the array storing the layer's weight values. In embodiments mainly described here, the network is a binary neural network in which the weights are stored as binary values in the memory cells of the array and input will be a binary valued vector of input values. As illustrated above with respect to FIG. 13, the multiple components of the input vector $IN_i$ is converted by the DACs $1311_i$ into the voltage levels $V_i^{in}$ that are applied to the corresponding word lines $WL_i$. The result is the in-array multiplication between the input vector and weights as stored in the memory cells $M_{i,j}$ $1301_{i,j}$, so that the current from each memory cell corresponds to a product of its weight value and the applied input, and where the current on each bit line is the sum of currents from each of the memory cells along the bits, as described above with respect to Equations 1 and 2.

Step 2015 determines the current $I_j^{out}$ on each of the bit lines $BL_j$ that corresponds to the product of Equation 2 and which is converted by the ADCs $1313_j$ into the digital output values $OUT_j$. These partial products of the individual columns can then be accumulated in the digital computation block 1315 to generate the output for the layer in step 2017. Step 2019 corresponds to the additional propagation of the output from step 2017. Depending on the embodiment, step 2019 can include applying activation functions, repeating the early steps of the inferencing operation for additional values, providing the output of the layer, or some combination of these. The output of the layer can then be used as the input to a subsequent layer of the network or final output for the network, depending on the layer's location within the network.

Figure 21:
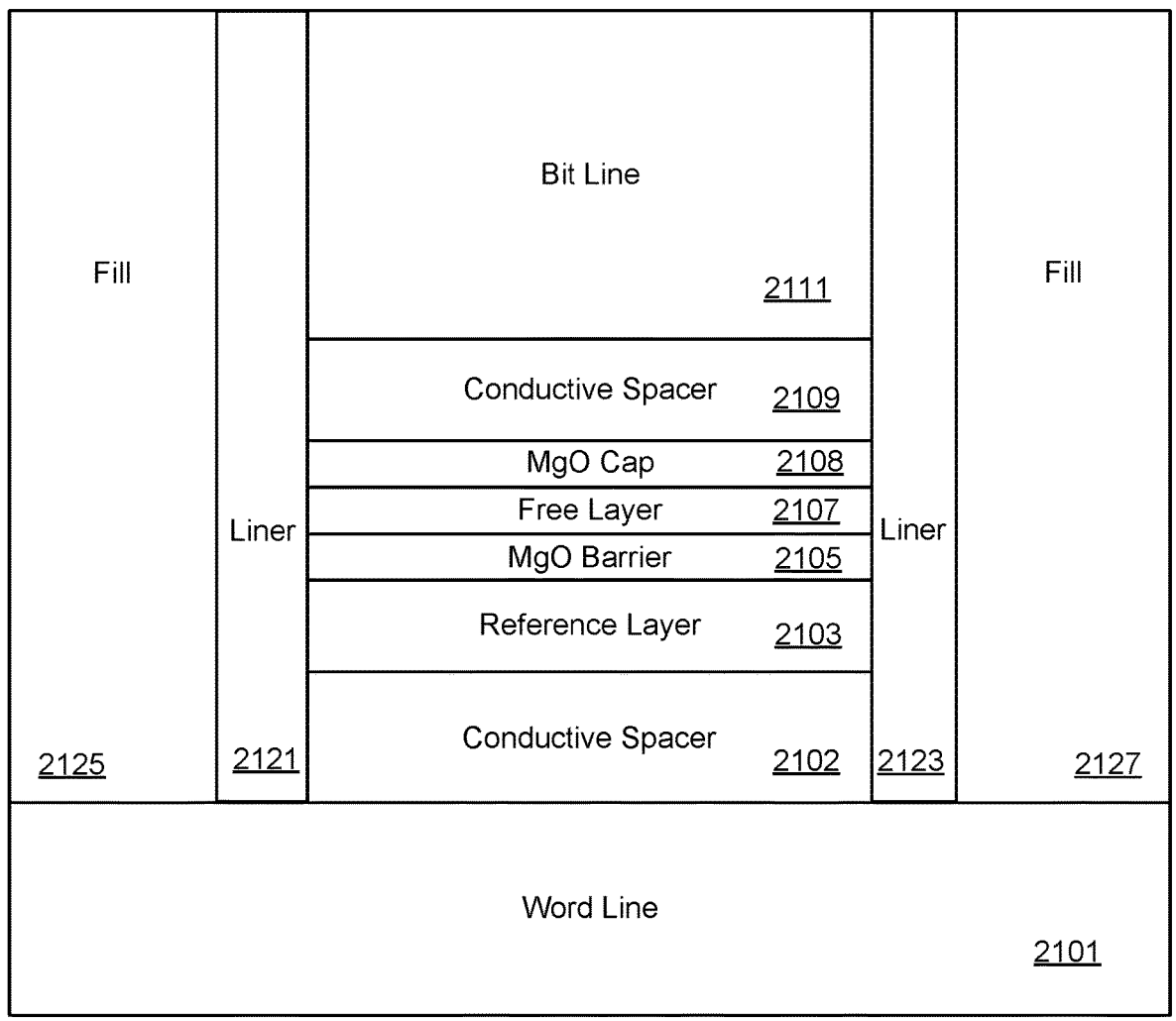
FIG. 21 illustrates an embodiment of an MRAM memory cell design in more detail.

FIG. 21 illustrates an embodiment for an MRAM memory cell design in more detail. When placed in a crosspoint array, the top and bottom electrodes of the MRAM memory cells will be the top and bottom wires of the array. In the embodiment shown here, the bottom electrode is the word line 2101 and the top electron is the bit line 2111 of the memory cell, but these can be reversed in some embodiments. Between the word line 2101 and bit line 2111 are the reference layer 2103 and free layer 2107, which are again separated MgO barrier 2105. In the embodiment shown in FIG. 21, an MgO cap 2108 is also formed on top of the free layer 2107 and a conductive spacer 2109 is formed between the bit line 2111 and the MgO cap 2108. The reference layer 2103 is separated from the word line 2101 by another conductive spacer 2102. On either side of the memory cell structure is a liner 2121 and 2123, where these can be part of the same structure, but appear separate in the cross-section of FIG. 21. To either side of the liner 2121, 2123 is shown some of fill material 2125, 2127 used to fill in the otherwise empty regions of the cross-point structure.

As noted above, in MRAM cell structure used here in the external magnetic field programming assisted crosspoint structure, the memory cells can formed to have very high resistance values for both of the low resistance parallel state and the high resistance anti-parallel state, allowing for ultra-low power inferencing. In terms of the RA, or resistance-area product that gives the amount of resistance for a given area in the plane between the word line and bit line, depending on the embodiment, the RA can be tens of $\Omega\mu m^2$ (such as 20 $\Omega\mu m^2$), hundreds of $\Omega\mu m^2$, and even up to 1000 $\Omega\mu m^2$ or higher to provide device resistance of 1 M$\Omega$ or above for a memory cell with a total thickness of ~20-30 nm between word line 2101 and bit line 2111. This can be obtained along with a ratio of 100% or higher for the difference in resistance between the high resistance anti-parallel state and the low resistance parallel state: $(R_{AP}-R_P)/R_P>1$. Depending on the embodiments, the VCMA coefficient of the memory cell can be least 500 Oe/V or higher, such as 1 kOe/V and $H_c$ value free layer 2107 can be above 2 kOe, such as 4 kOe or higher.

With respect to the free layer design 2107, embodiments include CoFe or CoFeB Alloy with a thickness on the order ~1-2 nm, where an Ir layer can be interspersed in the free layer close to MgO barrier 2105 and the free layer 2107 can be doped with Ta, W, or Mo. Embodiments for the reference layer 2103 can include a bilayer of CoFeB and CoPt multilayer coupled with an Ir or Ru spacer 2102. The MgO cap 2108 is optional, but can be used to increase anisotropy of free layer 2107, where the RA of cap can be <10X RA of main barrier. The conductive spacers can be conductive metals such as Ta, W, Ru, CN, TiN, and TaN, among others.

In an alternate set of embodiments, the magnetic field assistance for programming can be supplemented or replaced to through use of an Oersted field generated on the memory die itself. The inference engine or more general MRAM array can still be a crosspoint MRAM array, but where the memory chip has capability to program the cells with an assist from magnetic fields generated on-chip. An array of conductive lines, such as of copper for example, that are not connected to the MRAM memory cells can be added either between the cells, or in a metal layer above or below the cells, that is used to generate a supplemental Oersted magnetic field and assist with the bit switching. The local Oersted magnetic field adds to the external field and serves to select a target cell for writing, where additional control circuitry can be added to the on-chip control circuitry to control the Oersted fields. This can lead to a simpler MRAM cell design as the cell need not be capable of VCMA or spin torque transfer switching, so that cells with a high ratio of differences of resistance between can be employed that have poor VCMA or spin torque transfer properties.

According to a first set of aspects, an apparatus includes a control circuit configured to connect to an array including a plurality of magnetoresistive random access memory (MRAM) memory cells connected along one or more bit lines. The control circuit is configured to: selectively bias individual ones of the MRAM memory cells to be programmed in response to an applied external magnetic field having a field strength above a first level and below a second level; and concurrently sense a first plurality of the MRAM memory cells connected along a shared bit line in response to a corresponding first plurality of input voltages applied to the first plurality of the MRAM memory cells.

In additional aspects, a method includes placing a non-volatile memory device in a first external magnetic field, where the memory device including a non-volatile memory array formed according to a cross-point architecture with a magnetoresistive random access memory (MRAM) cell at each cross-point of the memory array, the MRAM memory cells each having a reference layer and a free layer having magnetic fields with parallel polarities. With the non-volatile memory array in the first external magnetic field, the method also includes programming one or more selected MRAM memory cells along a first bit line of the memory array to have a free layer with an anti-parallel polarity relative to the reference layer of the selected memory cells by concurrently: biasing the first bit line to a low voltage value, for each of the MRAM memory cells, biasing a corresponding word line of the memory array to a write select voltage, biasing bit lines of the memory array other than the first bit line to a voltage level higher than the low voltage value, and biasing word lines not corresponding to a selected MRAM memory cell to a voltage level lower than the write select voltage value, the write select voltage configured such that the free layer of the of the selected MRAM memory cells reverses polarity while the polarity of the free layer of non-selected MRAM memory cells of the memory array do not reverse polarity.

In another set of aspects, a non-volatile memory device includes a memory array and one or more control circuits connected to the memory array. The memory array includes: a plurality of word lines; a plurality of bit lines; and a plurality of magnetoresistive random access memory (MRAM) cells, the memory array having a crosspoint architecture in which each of the MRAM memory cells is connected between a corresponding one of the bit lines and a corresponding one of the word lines. The one or more control circuits are configured to: bias the word lines and bit lines to program selected ones of the MRAM memory cells in response to an applied external magnetic field having a field strength above a first level and below a second level; and determine a multi-bit valued output on each of bit lines in response a voltage pattern applied to the plurality of bit lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a control circuit configured to connect to an array including a plurality of magnetoresistive random access memory (MRAM) memory cells connected along one or more bit lines, the control circuit is configured to:
     selectively bias individual ones of the MRAM memory cells to be programmed in response to an applied external magnetic field having a field strength above a first level and below a second level; and
     concurrently sense a first plurality of the MRAM memory cells connected along a shared bit line in response to a corresponding first plurality of input voltages applied to the first plurality of the MRAM memory cells,
   the control circuit comprising an analog to digital converter configured to receive a value of a current in the shared bit line in response to the corresponding first plurality of input voltages applied to the first plurality of the MRAM memory cells and determine a multi-bit output value from the current.

2. The apparatus of claim 1, wherein the control circuit is formed on a control die, the apparatus further comprising:
   a memory die including the array of MRAM memory cells, the memory die formed separately from and bonded to the control die.

3. The apparatus of claim 2, wherein the array comprises:
   the MRAM memory cells;
   a plurality of bit lines; and
   a plurality of word lines, the array formed according to a crosspoint architecture in which each of the MRAM memory cells is connected between a corresponding one of the bit lines and a corresponding one of the word lines.

4. The apparatus of claim 3, wherein the MRAM memory cells are formed to have a resistance-area product of 20 $\Omega\mu m^2$ or higher.

5. The apparatus of claim 3, the array further comprising:
   a plurality of conductive lines, wherein the control circuit is configured to bias the conductive lines to generate a supplemental magnetic field.

6. The apparatus of claim 3, wherein the control circuit comprises:
   one or more analog to digital converters connected to the bit lines and configured to receive a value of a current in each of the bit lines in response to corresponding first plurality of input voltages applied to the word lines and determine a multi-bit output value from each of the currents.

7. The apparatus of claim 6, wherein the control circuit further comprises:
   a digital computation circuit connected to the one or more analog to digital converters and configured to accumulate the multi-bit output values.

8. The apparatus of claim 7, wherein the MRAM memory cells are configured to store weights of a layer of a neural network, and wherein the control circuit is further configured to:
   receive a vector of input values for the layer of the neural network, the vector of input values having a plurality of components;
   convert the components of the vector of input values into a set of voltage levels; and
   apply each of the set of input voltages to a corresponding set of the word lines.

9. The apparatus of claim 8, wherein weights of the layer of the neural network are binary valued and the vector of input values for the layer is binary valued.

10. A method, comprising:
    placing a non-volatile memory device in a first external magnetic field, the memory device including a non-volatile memory array formed according to a crosspoint architecture with a magnetoresistive random access memory (MRAM) cell at each cross-point of the memory array, the MRAM memory cells each having a reference layer and a free layer having magnetic fields with parallel polarities; and
    with the non-volatile memory array in the first external magnetic field, programming one or more selected MRAM memory cells along a first bit line of the memory array to have a free layer with an anti-parallel polarity relative to the reference layer of the selected memory cells by concurrently:

biasing the first bit line to a low voltage value,
for each of the MRAM memory cells, biasing a corresponding word line of the memory array to a write select voltage,
biasing bit lines of the memory array other than the first bit line to a voltage level higher than the low voltage value, and
biasing word lines not corresponding to a selected MRAM memory cell to a voltage level lower than the write select voltage value, the write select voltage configured such that the free layer of the of the selected MRAM memory cells reverses polarity while the polarity of the free layer of non-selected MRAM memory cells of the memory array do not reverse polarity.

11. The method of claim 10, further comprising:
prior to placing the non-volatile memory device in the first external magnetic field and programming the selected MRAM memory cells along the first bit line of the memory array, initializing the non-volatile memory device by:
placing the non-volatile memory device in an initializing magnetic field, the initializing magnetic field configured to align the reference layers and free layers to have magnetic fields with parallel polarities.

12. A non-volatile memory device, comprising:
a memory array, comprising:
a plurality of word lines;
a plurality of bit lines; and
a plurality of magnetoresistive random access memory (MRAM) cells, the memory array having a crosspoint architecture in which each of the MRAM memory cells is connected between a corresponding one of the bit lines and a corresponding one of the word lines; and
one or more control circuits connected to the memory array and configured to:
bias the word lines and bit lines to program selected ones of the MRAM memory cells in response to an applied external magnetic field having a field strength above a first level and below a second level; and
determine a multi-bit valued output on each of bit lines in response a voltage pattern applied to the plurality of bit lines.

13. The non-volatile memory device of claim 12, wherein, to bias the word lines and bit lines to program selected ones of the MRAM memory cells in response to an applied external magnetic field, the one or more control circuits are configured to concurrently:
bias one or more first selected word lines to a write select voltage;
bias a first selected bit line to a low voltage value; and
biasing bit lines of the memory array other than the first selected bit line to a voltage level higher than the low voltage value, and
biasing word lines other than the first selected word lines to a voltage level lower than the write select voltage value.

14. The non-volatile memory device of claim 13, wherein, to bias the word lines and bit lines to program selected ones of the MRAM memory cells in response to an applied external magnetic field, the one or more control circuits are, subsequent to biasing the first selected bit line to the low voltage value, further configured to concurrently:
bias one or more second selected word lines to the write select voltage;
bias a second selected bit line to the low voltage value; and
biasing bit lines of the memory array other than the second selected bit line to a voltage level higher than the low voltage value, and
biasing word lines other than the selected word lines to a voltage level lower than the write select voltage value.

15. The non-volatile memory device of claim 12, wherein the MRAM memory cells are configured to store weights of a layer of a neural network, and wherein the one or more control circuits are further configured to:
receive a vector input values for the layer of the neural network; and
perform an in-array multiplication operation for neural network by converting components of the vector input values into a set of voltage levels and concurrently applying the set of voltage levels to a corresponding set of the word lines.

16. The non-volatile memory device of claim 15, wherein the one or more control circuits are further configured to:
determine a multi-bit output value from a current value in each of the bit lines in response to the in-array multiplication operation; and
accumulate the multi-bit output values.

17. The non-volatile memory device of claim 12, wherein the MRAM memory cells are formed to have a resistance-area product of 20 $\Omega\mu m^2$ or higher.

18. The non-volatile memory device claim 12, wherein the non-volatile memory device comprises:
a bonded die pair, comprising:
a memory die including the memory array; and
a control die, formed separately from and bonded to the memory die and including the one or more control circuits.

19. The non-volatile memory device of claim 12, the memory array further comprising:
a plurality of conductive lines, and
wherein the one or more control circuits are further configured to bias the conductive lines to generate a supplemental magnetic field.

* * * * *